US010868492B2

(12) United States Patent
Collins

(10) Patent No.: US 10,868,492 B2
(45) Date of Patent: *Dec. 15, 2020

(54) SOLAR PANEL MOUNTING APPARATUS AND SYSTEM

(71) Applicant: Forrest Collins, Boulder, CO (US)

(72) Inventor: Forrest Collins, Boulder, CO (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/404,434

(22) Filed: May 6, 2019

(65) Prior Publication Data

US 2019/0260329 A1 Aug. 22, 2019

Related U.S. Application Data

(63) Continuation-in-part of application No. 15/658,122, filed on Jul. 24, 2017, now Pat. No. 10,284,135.
(Continued)

(51) Int. Cl.
*H02S 30/10* (2014.01)
*H01L 31/04* (2014.01)
(Continued)

(52) U.S. Cl.
CPC ............ *H02S 30/10* (2014.12); *F24S 25/12* (2018.05); *F24S 25/617* (2018.05);
(Continued)

(58) Field of Classification Search
CPC .......... H02S 30/10; H02S 40/36; H02S 30/20; H02S 20/20; H02S 30/00; F24S 25/12;
(Continued)

(56) References Cited

U.S. PATENT DOCUMENTS

| 5,349,975 A | 9/1994 | Valdner |
| 6,298,866 B1 | 10/2001 | Molnar, IV |

(Continued)

FOREIGN PATENT DOCUMENTS

| CN | 205006303 U | 2/2016 | |
| WO | WO-9318554 A1 * | 9/1993 | ............. H02S 30/20 |
| WO | 2012063233 A1 | 5/2012 | |

OTHER PUBLICATIONS

Chapman, Jeanette E., "Office Action Re U.S. Appl. No. 15/227,804", dated Nov. 17, 2016, p. 41, Published in: US.
(Continued)

*Primary Examiner* — Jeanette E Chapman
(74) *Attorney, Agent, or Firm* — Neugeboren O'Dowd PC

(57) ABSTRACT

A solar panel mounting system included a top hub and bottom hub comprising a receptacle in a center portion of the hub shaped to receive a pole and a plurality of attachment points affixed to an exterior portion of the receptacle, a girder assembly comprising: a plurality of top girders and a plurality of bottom girders each of the plurality of bottom girders being configured to be mechanically fastened the bottom hub at their proximal ends and each of the plurality of bottom girders being configured to be mechanically fastened to the plurality of top girders; and a plurality of mounting module purlins, wherein each of the module mounting purlins connect to at least two of the plurality of top girders, and wherein each of the plurality of mounting module purlins is radially connected to at least one other of the plurality of module mounting purlins.

20 Claims, 26 Drawing Sheets

Related U.S. Application Data which is a continuation-in-part of application No. 15/227,804, filed on Aug. 3, 2016, now Pat. No. 9,716,464.

(60) Provisional application No. 62/200,373, filed on Aug. 3, 2015.

(51) Int. Cl.

| | |
|---|---|
| *H01L 31/05* | (2014.01) |
| *F24S 25/12* | (2018.01) |
| *F24S 25/61* | (2018.01) |
| *H02S 40/36* | (2014.01) |
| *H02S 30/20* | (2014.01) |
| *F24S 30/42* | (2018.01) |
| *H02S 20/20* | (2014.01) |
| *H02S 30/00* | (2014.01) |
| *H01L 31/048* | (2014.01) |
| *F24S 25/617* | (2018.01) |
| *F24S 30/425* | (2018.01) |
| *F24S 20/00* | (2018.01) |

(52) U.S. Cl.
CPC .......... *F24S 30/425* (2018.05); *H01L 31/048* (2013.01); *H01L 31/0508* (2013.01); *H02S 20/20* (2014.12); *H02S 30/00* (2013.01); *H02S 30/20* (2014.12); *H02S 40/36* (2014.12); *F24S 2020/10* (2018.05)

(58) Field of Classification Search
CPC .... F24S 25/617; F24S 30/425; F24S 2020/10; H01L 31/048; H01L 31/0508
USPC ........................................................ 52/173.3
See application file for complete search history.

(56) References Cited

U.S. PATENT DOCUMENTS

| | | | |
|---|---|---|---|
| 6,830,058 B2 | 12/2004 | Li | |
| 8,029,154 B2 | 10/2011 | Myer | |
| 8,314,328 B1 | 11/2012 | Jacobs et al. | |
| 8,374,655 B2 | 2/2013 | Yamashita et al. | |
| 8,497,656 B2 | 7/2013 | Portis, Jr. et al. | |
| 8,561,625 B2* | 10/2013 | Chen | A45B 11/00 |
| | | | 135/20.3 |
| 8,640,394 B2 | 2/2014 | Richardson | |
| 8,695,614 B2 | 4/2014 | Chaimovski et al. | |
| 8,757,183 B2 | 6/2014 | Volin | |
| 9,185,988 B1* | 11/2015 | Sanchez | A47C 7/66 |
| 9,302,590 B2 | 4/2016 | Santos Silva Serra Duarte | |
| 9,775,416 B2* | 10/2017 | Harris | A45B 11/00 |
| 9,820,540 B2* | 11/2017 | Pan | A45B 25/14 |
| 9,912,286 B2* | 3/2018 | Rossi | H02S 30/20 |
| 10,161,582 B1* | 12/2018 | Qiu | F21V 21/0832 |
| 10,233,664 B2* | 3/2019 | Choi | F21S 9/032 |
| 10,459,145 B2* | 10/2019 | Popovich | G02B 6/0028 |
| 2003/0084931 A1* | 5/2003 | Lee | F21S 4/20 |
| | | | 135/16 |
| 2003/0094194 A1 | 5/2003 | Mattiuzzo | |
| 2004/0228118 A1 | 11/2004 | Peterson | |
| 2007/0283987 A1 | 12/2007 | Reyes et al. | |
| 2008/0092440 A1* | 4/2008 | Johnson | A01G 27/006 |
| | | | 47/48.5 |
| 2008/0092936 A1 | 4/2008 | Carabillo | |
| 2010/0000596 A1 | 1/2010 | Mackler | |
| 2010/0154786 A1 | 6/2010 | Li | |
| 2010/0307153 A1* | 12/2010 | Hinderling | F24S 25/16 |
| | | | 60/641.8 |
| 2010/0326849 A1* | 12/2010 | Trimarche | A45B 3/04 |
| | | | 206/223 |
| 2011/0005560 A1 | 1/2011 | Nair | |
| 2011/0203633 A1 | 8/2011 | Richardson | |
| 2011/0290288 A1 | 12/2011 | Ma | |
| 2013/0080254 A1 | 3/2013 | Thramann | |
| 2013/0118099 A1 | 5/2013 | Scanlon | |
| 2013/0240024 A1* | 9/2013 | Kim | H02S 20/23 |
| | | | 136/251 |
| 2014/0366922 A1* | 12/2014 | King | E04H 15/48 |
| | | | 135/96 |
| 2015/0043200 A1 | 2/2015 | Wilson | |
| 2015/0288317 A1 | 10/2015 | Huang et al. | |

OTHER PUBLICATIONS

Otero, Vanessa, "Response to Office Action Regarding U.S. Appl. No. 15/227,804", dated Feb. 17, 2017, p. 12, Published in: US.

Chapmann, Jeanette E., "Office Action Regarding U.S. Appl. No. 15/658,122", dated Aug. 16, 2018, p. 20, Published in: US.

Otero, Vanessa L., "Response to Office Action Regarding U.S. Appl. No. 15/658,122", dated Nov. 19, 2018, p. 10, Published in: US.

* cited by examiner

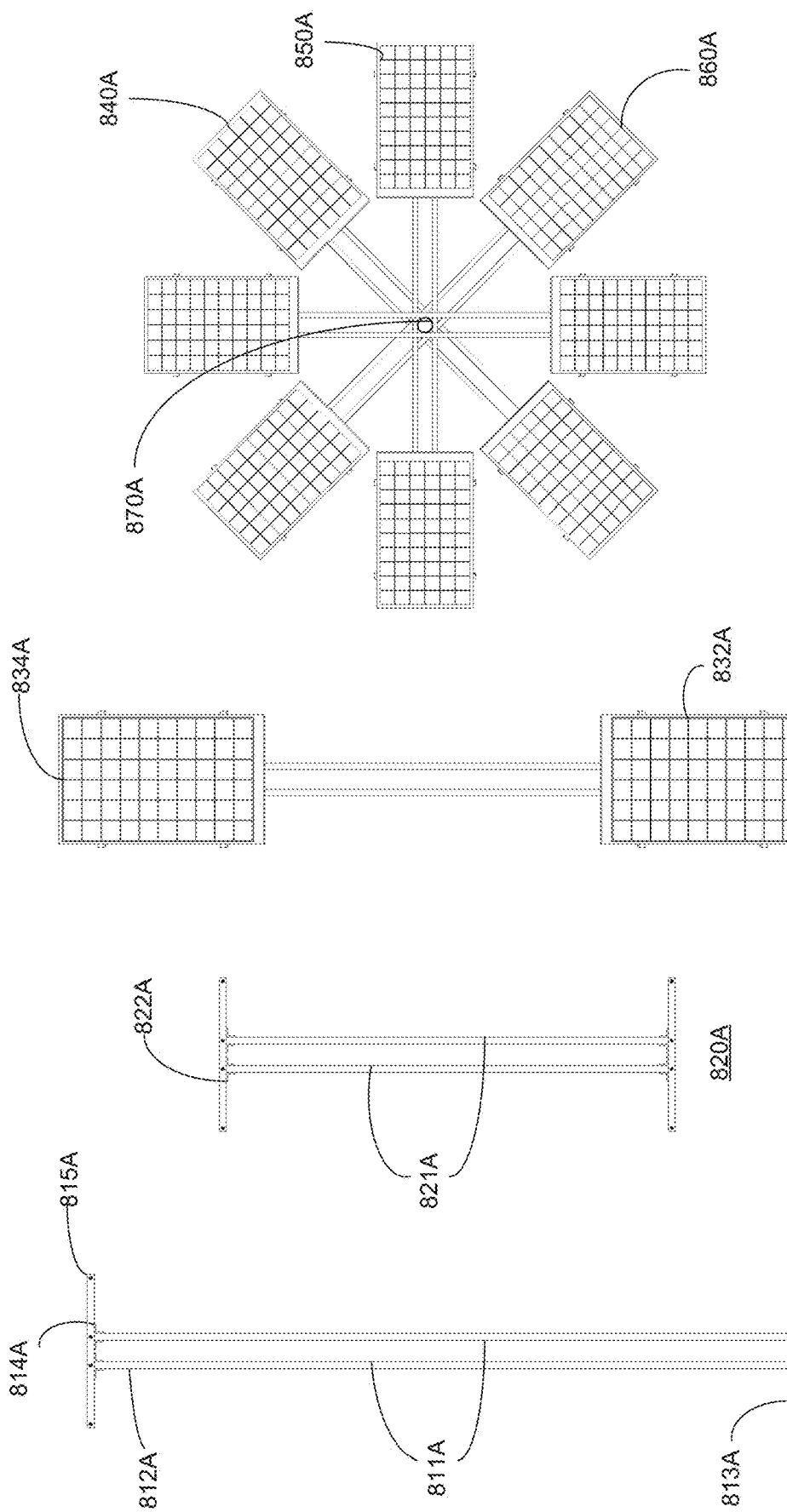

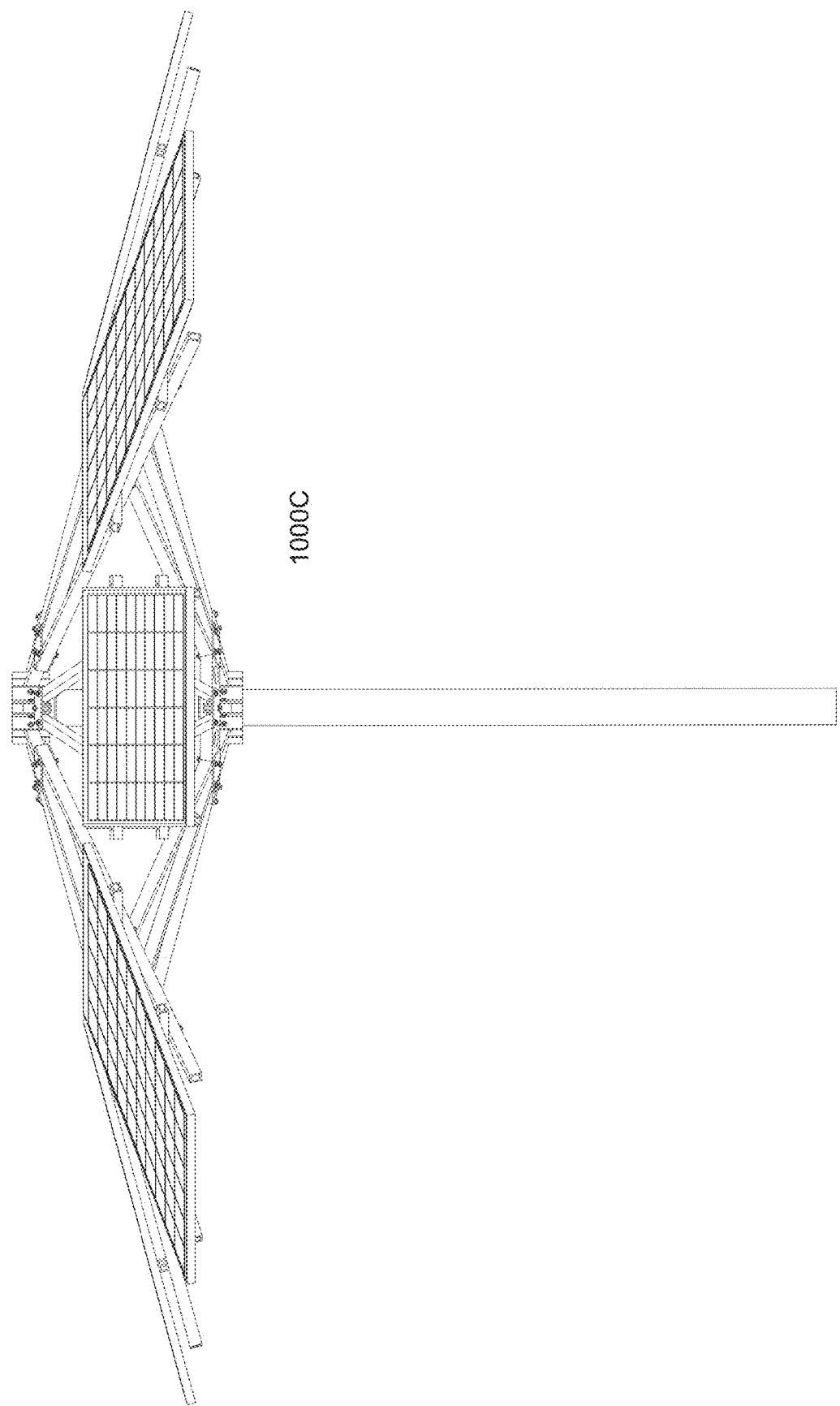

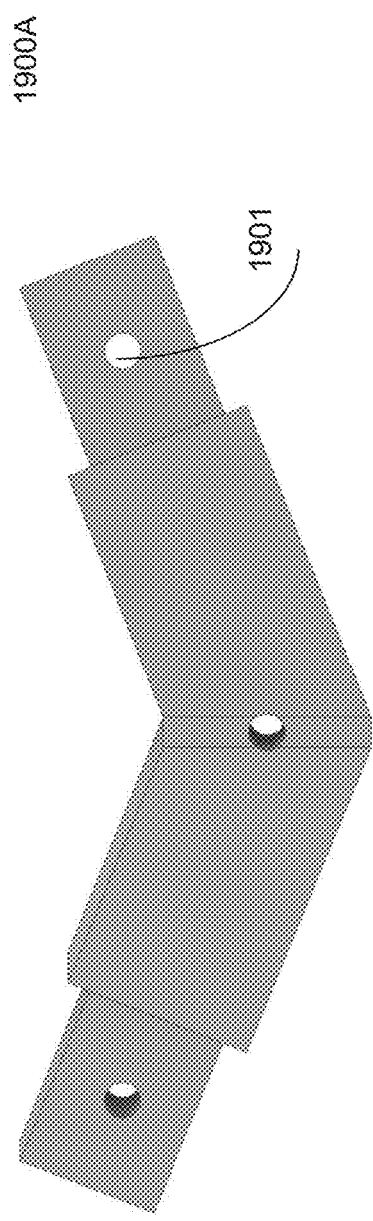
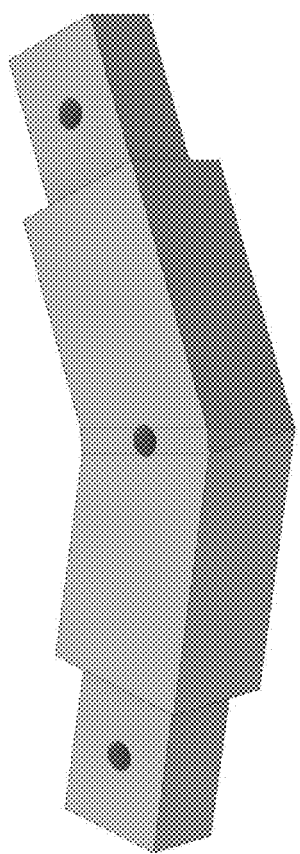
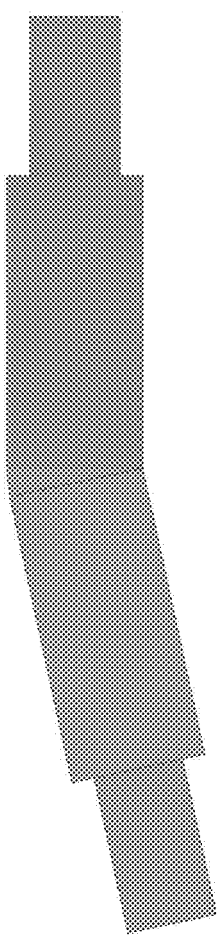
FIG. 19A
FIG. 19B
FIG. 19C

SOLAR PANEL MOUNTING APPARATUS AND SYSTEM

CROSS-REFERENCE TO RELATED APPLICATIONS

This application is a continuation in part of U.S. patent application Ser. No. 15/658,122 entitled "SOLAR PANEL MOUNTING APPARATUS AND SYSTEM" filed Jul. 24, 2017, which is a continuation in part of U.S. patent application Ser. No. 15/227,804 entitled "SOLAR PANEL MOUNTING APPARATUS AND SYSTEM" filed Aug. 3, 2016 and issued on Jul. 25, 2017 as U.S. Pat. No. 9,716,464, which, in turn, claims priority to earlier filed U.S. Provisional Application No. 62/200,373 entitled "SOLAR PANEL MOUNTING APPARATUS AND SYSTEM" filed Aug. 3, 2015, and the entire disclosure of which is hereby incorporated by reference for all proper purposes.

FIELD OF THE DISCLOSURE

The present disclosure relates to systems and apparatuses for mounting solar panels. In particular, but without limitation, the present disclosure relates to mounting solar panels on posts and poles in order to efficiently use space while simultaneously increasing solar power generation.

BACKGROUND OF THE DISCLOSURE

Solar panels are increasingly being used to provide renewable energy in a number of applications. For example, homeowners can now have solar panels installed including on their rooftops, business owners can install them on commercial buildings, and large-scale users and utility companies can have dedicated solar arrays in fields for generating large amounts of power. Smaller-scale applications have also become popular. One common small-scale application is to power streetlights. In existing solar streetlight applications, one or two solar panel modules are typically mounted in a south facing orientation and are attached to an existing streetlight pole. Some of these solar streetlight designs include batteries for storing generated solar power, which allow for off-grid lighting applications that are useful when it is cost-prohibitive to extend utility power from a grid to the streetlight location. For example, many solar streetlights are on remote highways, which are difficult to connect to a grid. On these kinds of streetlights, solar power modules (also known and referred to herein as solar panels, photovoltaic panels or modules, or PV panels or modules) are typically mounted using a triangle cantilevered out from the main pole. Many solar-powered street and parking lot lights combine the benefits of LED lighting (e.g., low energy usage, long lifespan) with the renewable solar power to light the LEDs, which conserves the amount of energy needed to provide light.

For any solar power application, the total installed cost and value proposition to the end customer (i.e., the consumer of the energy produced) are major considerations for the widespread adoption of solar technology for that particular application. Current designs of solar powered streetlights are focused on maximizing power output per module simply for the purposes of powering the light, and do not consider maximizing the power generation possible from the location of each pole. Therefore, only small solar panels, in small numbers, have heretofore been attached to existing poles, and the applications of solar power generated from solar panels attached to poles has been limited. This is because the weight and space of many existing solar panels makes it difficult to physically attach solar panels to poles. Several other challenges to doing so exist as well. For example, attaching one or more solar panels to a pole would have to account for wind, weather, and the challenge of connecting produced power to individual users or a grid.

Given the ubiquity of existing poles that sit in direct sunlight all day, however, an opportunity exists for apparatuses and systems for mounting solar panels to such poles and connecting the power produced therefrom to end users.

SUMMARY

An aspect of the present disclosure provides solar panel mounting system comprising a top hub and a bottom hub, each of the top hub and the bottom hub comprising: a receptacle in a center portion of the hub shaped to receive a pole and a plurality of attachment points affixed to an exterior portion of the receptacle. The solar panel mounting system may further comprise a girder assembly comprising: a plurality of top girders each having a proximal end and a distal end, each of the plurality of top girders being configured to be mechanically fastened to the top hub at their proximal ends, and each of the plurality of top girders having a distance between the distal ends of the top girders that is greater than a distance between the proximal ends of the top girders; and a plurality of bottom girders each having a proximal and a distal end, each of the plurality of bottom girders being configured to be mechanically fastened the bottom hub at their proximal ends and each of the plurality of bottom girders being configured to be mechanically fastened to the plurality of top girders. The solar panel mounting system may further comprise a plurality of mounting module purlins, wherein each of the module mounting purlins connect to at least two of the plurality of top girders, and wherein each of the plurality of mounting module purlins is radially connected to at least one other of the plurality of module mounting purlins.

Another aspect of the present disclosure provides a solar panel mounting system comprising a top hub and a bottom hub, each of the top hub and the bottom hub comprising a receptacle in a center portion of the hub shaped to receive a pole and a plurality of attachment points affixed to an exterior portion of the receptacle. The solar panel mounting assembly may comprise a girder assembly comprising a plurality of top girders each having a proximal end and a distal end, each of the plurality of top girders being configured to be mechanically fastened to the top hub at their proximal ends, and each of the plurality of top girders having a distance between the distal ends of the top girders that is greater than a distance between the proximal ends of the top girders; and a plurality of bottom girders each having a proximal and a distal end, each of the plurality of bottom girders being configured to be mechanically fastened the bottom hub at their proximal ends and each of the plurality of bottom girders being configured to be mechanically fastened to the plurality of top girders. The solar panel mounting assembly may further comprise a plurality of mounting module purlins, wherein each of the module mounting purlins connect to at least two of the plurality of top girders, wherein the plurality of top girders and the plurality of module mounting purlins are configured to mount one or more solar panels in between two of the plurality of top girders.

Yet another aspect of the disclosure provides a solar panel mounting system comprising: a top hub and a bottom hub, each of the top hub and the bottom hub comprising: a receptacle in a center portion of the hub shaped to receive a pole and a plurality of attachment points affixed to an exterior portion of the receptacle. The solar panel mounting system may further comprise a girder assembly comprising a plurality of top girders each having a proximal end and a distal end, each of the plurality of top girders being configured to be mechanically fastened to the top hub at their proximal ends, and each of the plurality of top girders having a distance between the distal ends of the top girders that is greater than a distance between the proximal ends of the top girders. The solar panel mounting system may further comprise a plurality of mounting module purlins, wherein each of the module mounting purlins connect to at least two of the plurality of top girders, and wherein each of the plurality of mounting module purlins is radially connected to at least one other of the plurality of module mounting purlins.

BRIEF DESCRIPTION OF THE DRAWINGS

FIGS. 8A and 8B show subcomponents and full assemblies of girders in an alternative embodiment of the present disclosure;

FIGS. 10A, 10B, and 10C show top, bottom, and side views, respectively, of a solar panel mounting apparatus of the present disclosure;

FIGS. 19A, 19B, and 19C are a top, side and perspective view, respectively, of a purlin joiner used to join purlins of a solar panel mounting apparatus according to the present disclosure;

DETAILED DESCRIPTION

Figure 1:
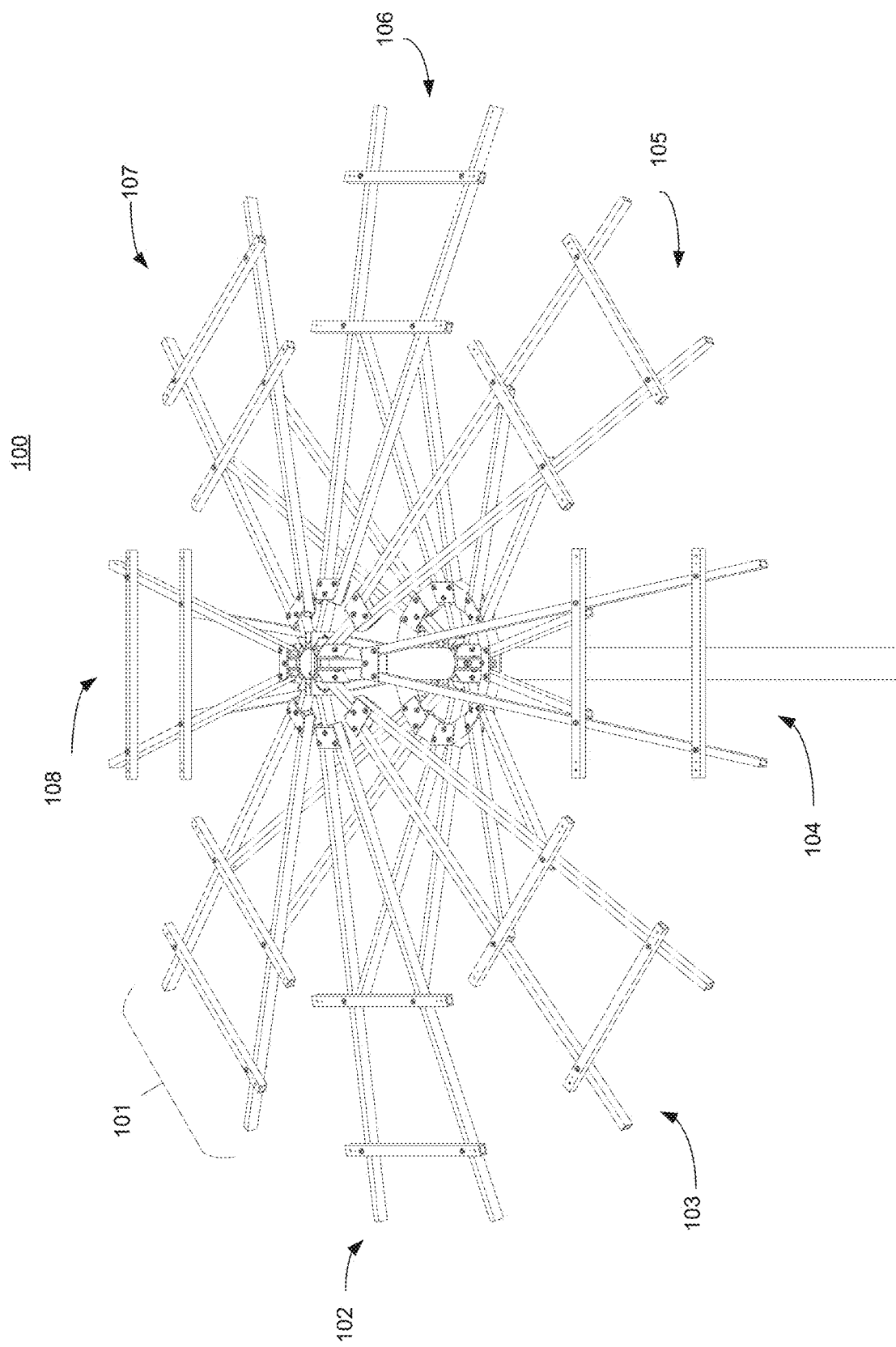
FIG. 1 is a top perspective view of a solar panel mounting apparatus of the present disclosure.
Figure 2:
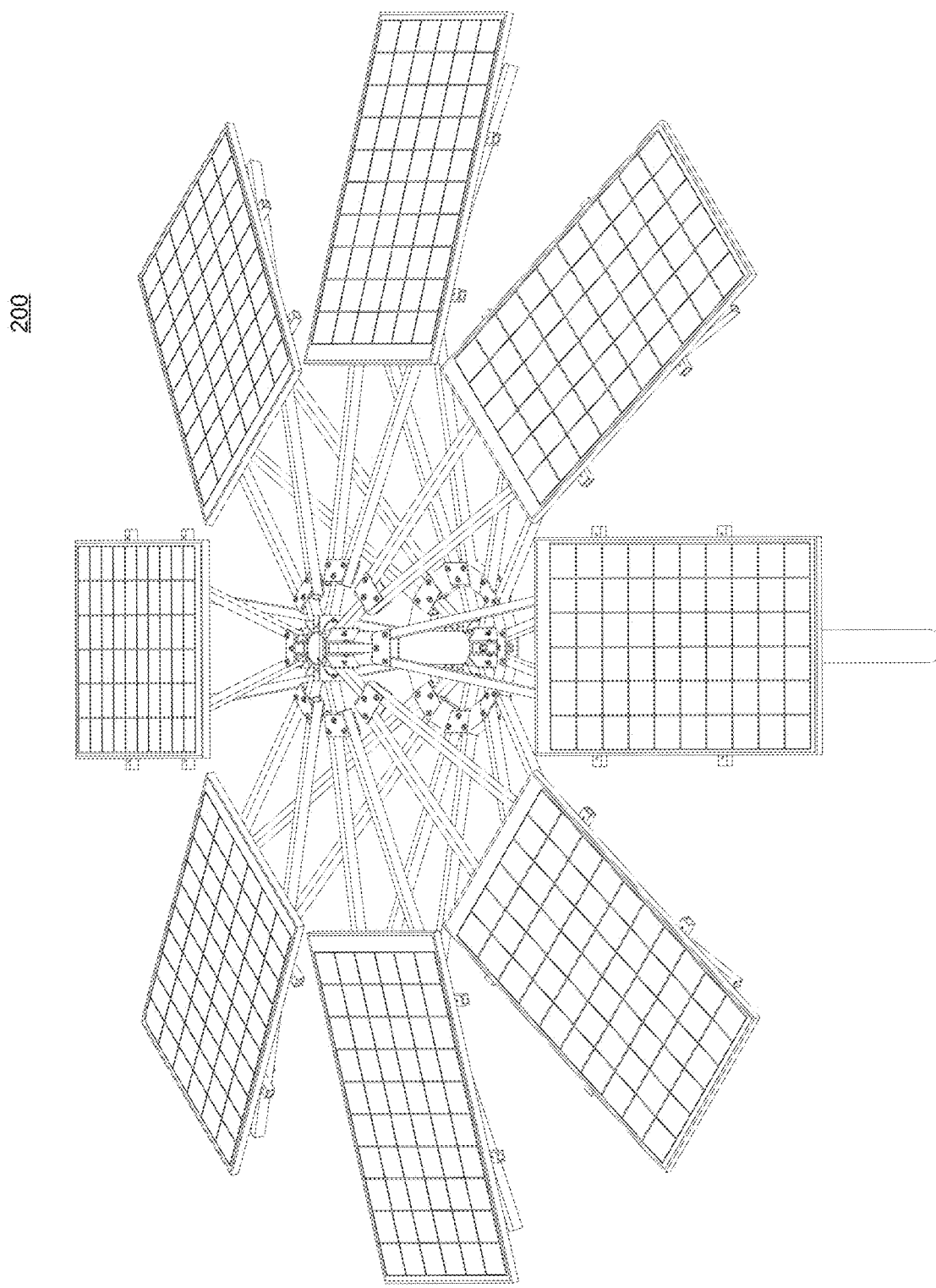
FIG. 2 is a top perspective view of a solar panel mounting apparatus of the present disclosure with solar panels attached.

One aspect of the present disclosure provides a structure for mounting a PV module on a pole, such that multiple PV modules may be mounted on and around one pole in a radial configuration. FIG. 1 shows an exemplary configuration of a PV mounting system 100 of the present disclosure without any PV modules attached. As shown, the mounting system 100 is arranged such that when PV modules are mounted to it, the solar panels form an umbrella-shaped canopy comprised of a plurality of PV modules. Turning to FIG. 2, show is a mounting system 200 with PV panels attached. The mechanisms and apparatuses comprising the mounting systems 100 and 200 of FIGS. 1 and 2 will be described in greater detail throughout the disclosure. Although seven individual mounting structures (also referred to herein as girder assemblies) 101-108 are shown in FIG. 1, any number of PV modules may be mounted on a pole using the mounting structures of the present disclosure.

There are several advantages to using the mounting structures of the present disclosure. One advantage is that existing pole structures that were not necessarily originally designed for solar power generation may now be used for such purposes. Often, solar panels are mounted on large, uninterrupted, sloped surfaces, for several reasons. One reason is that solar panels can be relatively heavy—approximately 50 lbs. each, in many cases. They are often rectangular, and in order to maximize the space on an available surface, the rectangular modules are mounted with their sides flush against one another. Many existing mounts for solar panels are arranged so that the rectangular panels line up in rows. The main reason solar panels are mounted at an angle relative to the ground, instead of flat, is that the angle increases the amount of sun exposure. Because of the need to mount heavy, rectangular panels at an angle, the most common surfaces for mounting solar panels are rooftops of buildings, rooftops of carports, and open fields.

Mounting PV panels on rooftops of buildings is often considered the most advantageous location to place them, because it makes use of space exposed to the sun that is not being used for other purposes. However, there are some drawbacks to mounting PV panels on rooftops. For example, it is generally preferable (in the northern hemisphere) to mount PV panels on south-facing or west-facing portions of rooftops in order to maximize sun exposure. If a particular rooftop is configured such that it does not have a large surface area that faces south or west, it may be inefficient to install PV panels on that particular rooftop. Even if a rooftop does have a large south or west facing surface area, other barriers to installation can exist. For example, the number of panels needed to generate sufficient energy for the building might exceed the weight that the roof can bear. This problem can be especially acute in commercial buildings, where the building itself has large power demands, but space on the rooftop is limited by other fixtures. For example, commercial buildings can have large numbers of fixtures protruding from the ceiling for various HVAC and electrical requirements, which can limit the space available to install PV panels. In some cases, trees or other buildings can cast shade on otherwise optimal spots for PV panel installation on a roof.

Many commercial buildings that have limitations of rooftop space have surrounding parking lots, which are often used as alternative installation locations. In order to install a large number of solar panels, some users have built carports, which have the advantages of having roofs with large, uninterrupted surface areas sloped at ideal angles for maximizing power generation. Carports also provide shade for cars parked underneath. A main disadvantage to building a carport is cost. Parking lots may also have existing landscaping, including trees, plants, medians, and existing light poles that may need to be removed or designed around in order to build a carport. Zoning regulations may also impede the construction of a large carport structure.

Open field and open space solar panel installations are typically only seen in locations where the land is not used for any other purpose. It can be advantageous to use otherwise unused open land to install solar panels because ground-based mounts can be pointed and angled in the most ideal direction and manner. In suburban or urban environments, however, large installations of solar panels on the ground, in open space or fields, is often impractical because of the cost of the space or the unavailability of such open space in general. Even space in a park or on farmland is unlikely to be used for solar installations because such an installation would detract from the intended use of the space.

Figure 3:
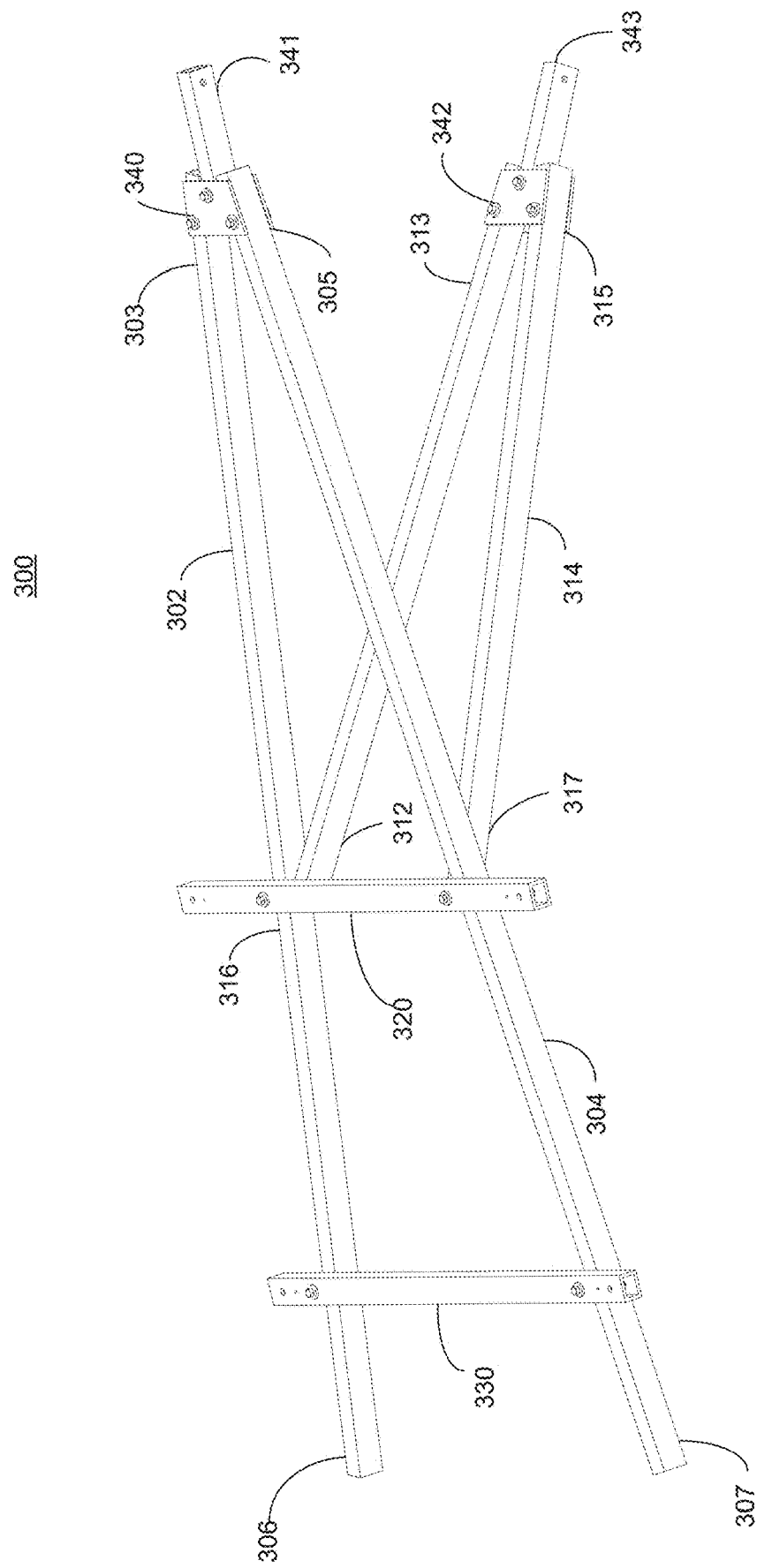
FIG. 3 is side perspective view of a girder assembly upon which a solar panel may be mounted according to the present disclosure.

The PV mounting structures and systems of the present disclosure provide a number of advantages in view of the challenges associated with installing PV panels in other locations, which will become apparent throughout the disclosure. Turning to FIG. 3, shown is an exemplary girder assembly 300, which may be used for mounting a single PV panel. Girder assembly 300 comprises two top girders 302, 304, the proximal ends 303, 305 of which may be configured to be mechanically fastened to each other or to additional structures and form a point of attachment to a pole. The distal ends 306, 307 of the top girders 302, 304 may be spaced apart from each other to form a base of support for a PV panel. The ends of the top girders 302, 304 are referred to herein as "proximal" and "distal" in relation to a central pole to which the girder assembly 300 may ultimately be joined. As shown, the distal ends 306, 307 of the top girders 302, 304 are spaced apart underneath a location where the PV module would be mounted, and the top girders 302 and 304 taper together until they join at their proximal ends 303, 305 at the point of attachment to each other.

The girder assembly 300 also comprises bottom girders 312, 214, which may attach or be otherwise configured to be mechanically fastened at their respective proximal ends 313, 315 to each other. The bottom girders 312, 314 may be attached at their distal ends 316, 317 to an upper module mounting purlin 320, which will be described presently. Alternatively, the bottom girders 312, 314 may be attached to the top girders 302, 304. The bottom girders 312, 314 may be attached to the top girders 302, 304, or to the upper module mounting purlin 320 by bolts, screws, or other similar fastening hardware. It is also contemplated that the bottom girders 312, 314 may be fastened indirectly to the top girders 302, 304, or upper module mounting purlin 320, such as through a connecting plate or hinge. Alternatively, the bottom girders 312, 314 may be attached by welding or pressure fitting. Throughout the disclosure, any points of connection between components of the girder assembly, the hub apparatus (to be described in further detail later in this disclosure, and the pole) may be mechanically fastened, attached, or otherwise assembled in any manner described throughout the disclosure. As another example of a mechanical fastening method, aspects of the disclosure may include custom molded mating fittings of various material composition, which may allow for insertion or locking mechanisms to join any components of the solar panel mounting apparatus. The embodiments of the components shown herein may have pre-drilled holes to configure a component to be mechanically fastened to another, but this type of mechanical fastening is only one of the many methods contemplated. The girder assembly 300 also comprises a lower module mounting purlin 330, which may be attached to the girders by a bolted or other mechanical fastening connection.

Figure 4:
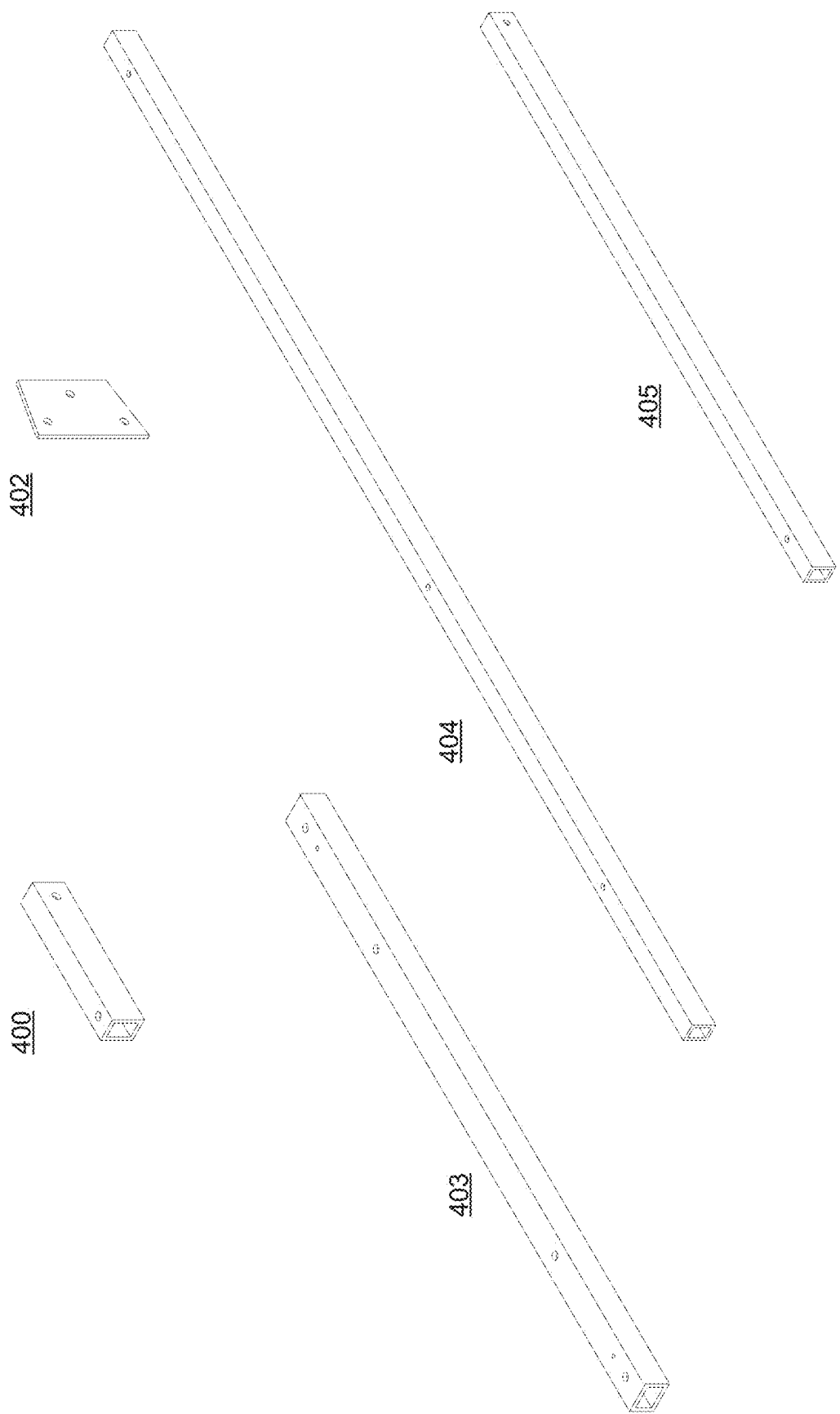
FIG. 4 shows an embodiment of a hub for mounting girders to poles according to the present disclosure.

Before describing additional aspects of the girder assembly 300, it is helpful to turn briefly to FIG. 4, which shows embodiments of individual components of the girder assembly 300 described in FIG. 3. Shown is a girder plate 402, which may comprise a metal (or other material) plate with pre-drilled holes for accepting bolts or other attachment hardware. Also shown is a hub girder 401. Turning back to FIG. 3, a girder plate 340 is shown connecting a hub girder 341 and top girders 302, 304 at their proximal end 303, 305. Though not visible in FIG. 3, another girder plate may connect the hub girder 341 and top girders 302, 304 on the undersides of the top girders 302, 304. Another girder plate 342 (or two of them) may similarly connect another hub girder 343 and the bottom girders 312, 314. The use of the girder plate 342 is one example of a way to indirectly fasten components of the girder assembly 300. Returning to FIG. 4, shown are embodiments of a module purlin 403 (which may be used as either the upper 320 or lower module mounting purlin 330), a top girder 404, and a bottom girder 405.

Though FIG. 4 shows a top girder 404 as a rigid, rectangular, hollow tube, other embodiments may be differently shaped. For example, the top girder 404 may be cylindrical, or not hollow. It is also contemplated that the top girder 404 may not necessarily be rigid. In some embodiments, the top girder 404 may comprise a cable. In embodiments utilizing a cable as a top girder, the cable may be kept in tension by its attachment point to the pole at the top and the weight of the solar panel while solar panel is supported by the bottom girder.

Additionally, though FIG. 3 shows two module mounting purlins, including the upper 320 and lower 330 module mounting purlins, in some embodiments, mounting purlins may not be necessary, in which case the solar panels may be mounted directly to the top girders. An additional embodiment is contemplated wherein only one top girder is used in a girder assembly instead of two. In such an embodiment, one or more module mounting purlins may be used to provide mounting stability for the width of a solar panel, and a module mounting purlin of one girder assembly may be attached to a module mounting purlin of a neighboring girder assembly for lateral stability. The use of one girder may provide the advantage of decreasing the overall weight of the girder assemblies mounted on a pole. The actual embodiments used may depend on varying needs of given applications, such as amount of vertical or lateral stability, weight of the total installed system, anticipated wind loads, and ease of construction, to name a few.

Each of the components of FIG. 4 are exemplary embodiments having pre-drilled holes configured to allow easy mechanical fastening of the components. An advantage of having separate components with pre-drilled holes is that the components may be shipped in a disassembled state and assembled by any end-user. However, it is contemplated that other embodiments of the disclosure may be implemented by mounting structures that are pre-assembled, or which may unitarily constructed. For example, girder assemblies may be entirely welded together in some embodiments.

Figure 5:
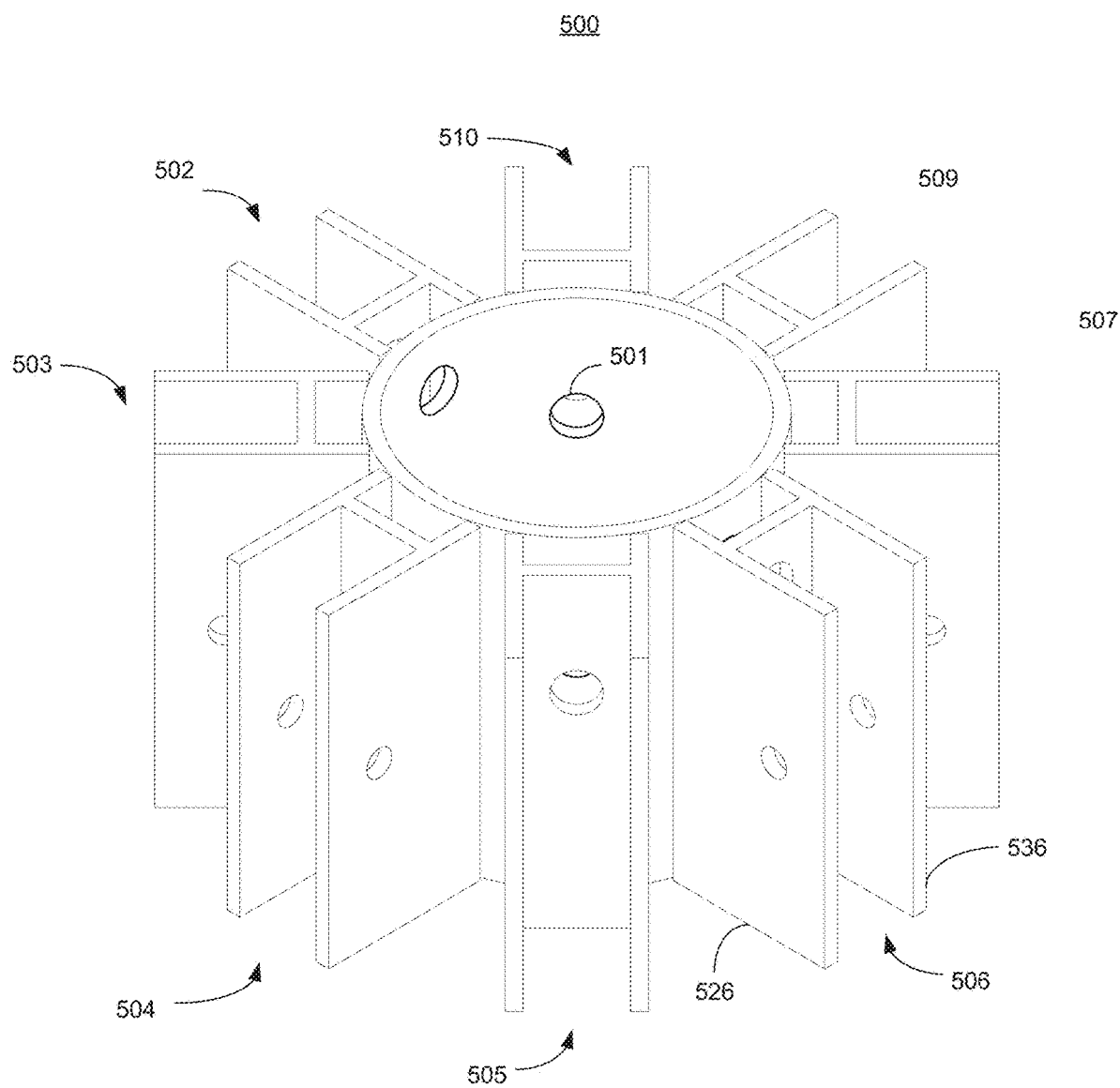
FIG. 5 shows subcomponents of a girder assembly that may be used to assemble girders of the present disclosure.

Referring now to FIG. 5, shown is an embodiment of a central mounting hub apparatus that may be used to attach a plurality of girder assemblies to a pole. In the embodiment shown, the hub 500 has a circular receptacle in its center defined by a wall 501, and a plurality of mounting brackets 502-510 protruding from the exterior of the wall 501. In other embodiments, the central mounting hub may have an octagonal receptacle for receiving and octagonal pole, a square receptacle for a square pole, or any other geometrically-shaped receptacle to conform to other kinds of poles. That is, embodiments of hubs of the present disclosure may be substantially similar on their exteriors, but differ in the shapes of their respective central openings for the purpose of accommodating differently-shaped poles. An advantage of using differently-shaped hubs is that the same girder assemblies can be adapted to fit a variety of existing poles and posts, with only the hub needing to be changed. Other geometrical shapes of the interior of the hub are contemplated. As shown, the wall may comprise one or more holes to allow the hub to be bolted to a pole.

In the embodiment shown, the central mounting hub has eight pairs of girder mounting brackets, though clearly other numbers of brackets (such as seven) are contemplated. Other types of attachment points may be used instead of the brackets shown herein. It is contemplated that other extrusions can be used to fit or insert girder assemblies to the central mounting hub. For example, though not shown, a hub girder may be comprised of a tube and may fit around an extrusion and be fastened from the outside of the hub girder. In the embodiment shown, each mounting bracket may comprise two spokes, such as spokes 526 and 536. Each spoke of a pair comprising a mounting bracket may extend from the wall 501 in substantially the same direction as the other spoke of the pair. A pair of mounting spokes 526, 536 may provide an attachment interface with a girder assembly, such as through the hub girder 341 of girder assembly 300 in FIG. 3. A pair of mounting spokes 526, 536 may be attached to a girder assembly by bolts or other suitable hardware. A bolt may attach the hub girder to the mounting brackets via pre-drilled holes in the spokes. Though many examples throughout the present disclosure related to embodiments using at least one central mounting hub, it is contemplated that girder assemblies of the present disclosure may actually be mounted without a central mounting hub. For example, a girder assembly may be directly welded to a post.

In the embodiment shown in FIG. 5, the central mounting hub apparatus has eight mounting brackets 502-510, but other embodiments may have more or fewer brackets, in order to accommodate different numbers of girder assemblies and corresponding PV panels. A central mounting hub could even be used for mounting a single girder assembly. In many embodiments, the central hub may be constructed as a unitary piece, and may be attached with one or more bolts or other fastening hardware to the pole itself, through one or more holes formed in the wall 510. Alternatively, a central mounting hub could be constructed in two pieces, with bolts attaching the two pieces of the central mounting hub together around the pole. Such an embodiment of the central mounting hub may reduce or eliminate shear stress on bolts that would be present in the single-piece construction embodiment. Some existing light posts are tapered, such that they are smallest at the top and widen towards the bottom. Certain embodiments of the central mounting hub, may be attached to such a tapered pole with limited hardware, with the geometry of the tapered pole preventing the hub from sliding down past a certain point and thereby supporting the weight of the hub. Alternative designs of the interior of the hub are contemplated, such as angling the interior surface, to increase the support and reduce stress on the surfaces of the hub.

Figure 6A:
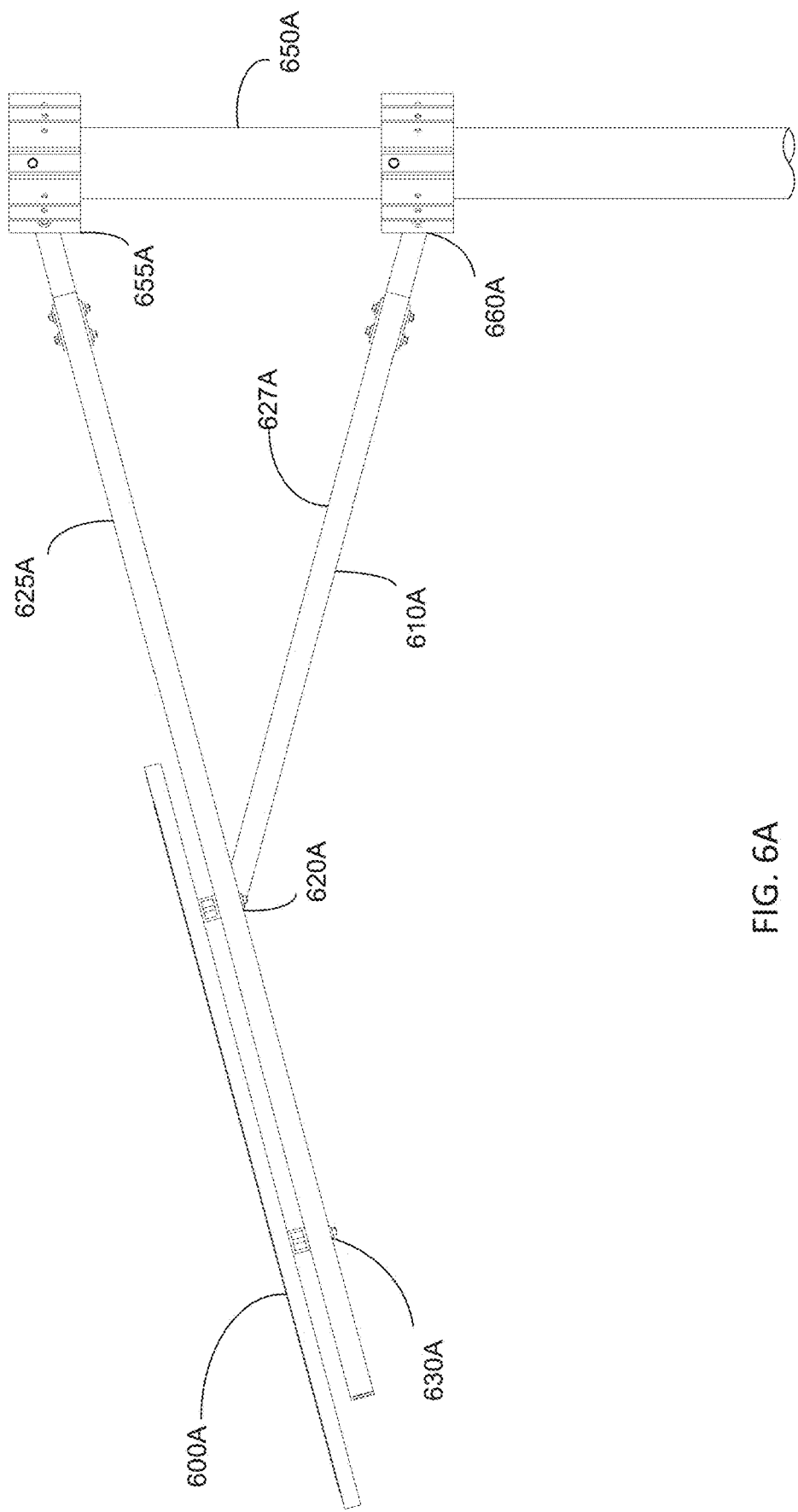
FIGS. 6A and 6B show a side view and a side perspective view, respectively, of a single girder assembly with a solar panel attached.
Figure 6B:
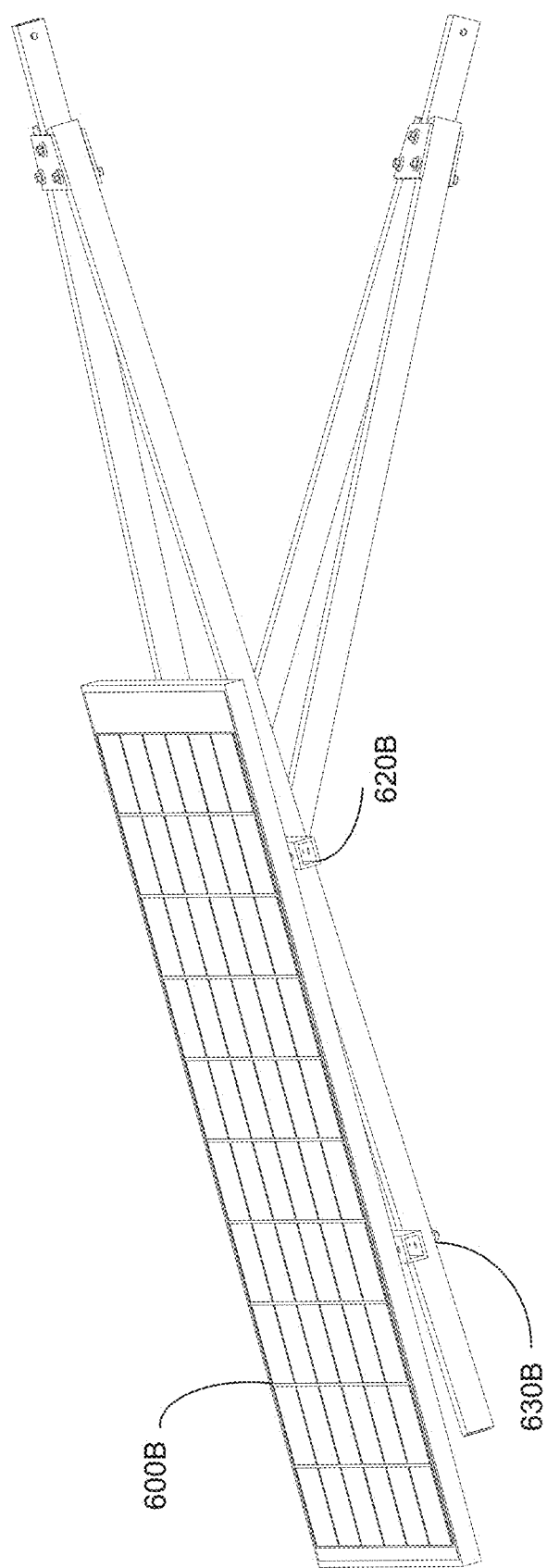

FIG. 6A shows a side view of a PV panel 600A and how it may be attached to the upper and lower module mounting purlins 620A and 630A. FIG. 6B shows a top perspective view of the same, with PV panel 600B attached to upper and lower module mounting purlins 620B and 630B. The PV panels 600A may be attached to the upper and lower module mounting purlins 620A and 630A by mounting hardware such as screws or bolts. In many embodiments, the upper and lower module mounting purlins 620A and 630A may have mounting holes and hardware that conform to industry standard sizes for PV panels.

In many embodiments of the disclosure, the girder assembly 610A, as shown in FIG. 6A, forms particular acute angles between a pole 650A, the top girders 625A, and the bottom girders 627A. For example, in one embodiment, the top girders 325A may form an approximately 15° angle with the pole 650A at the top hub attachment point 655A. Other angles may be formed between the pole 650A and the top hub attachment point 655A. Structures and mechanisms used for the top hub attachment 655A may include the previously described hub and hub girder, but may also comprise other types of attachments. The bottom girders 627A may form a 15° angle with the pole 650A at the lower support attachment point 660A when both the top girders 625A and the bottom girders 627A are attached to the pole 650A. In some embodiments, the bottom girders 627A may be bolted or welded directly to the pole 650A, and in other embodiments, the bottom girders 627A may be attached to a second lower hub. The angled relationship between the girders 625A, the bottom girders 627A, and the pole 650A allow the top girders 625A to be pulled into tension, thereby allowing the PV panel to be held at an angle along the length of the girders 625A, while simultaneously pushing down on the bottom girders 627A and transferring the weight of the PV panel 600A to the pole 650A. The connection between the top and/or bottom hub attachments and top and bottom girders may provide lateral stability to each girder assembly and its associated PV panel in order to prevent excessive movement as a result of lateral wind loads. In some embodiments, particularly when higher than average lateral wind loads are anticipated, additional structures may be added to enhance lateral stability. For example, lateral bracing may be added at various points along the girder assembly, or the top module purlins may all be connected once each girder assemble has been installed.

An advantage of the configuration of the girder assembly as shown is that a PV panel may be supported in a stable manner while held at an angle, mounted on a pole. It is contemplated that other suitable angles may also be formed in other embodiments of the girder assembly 610A for the purposes of supporting PV panel weight at various angles. Some advantages of the girder assembly for mounting a single PV panel include that each PV panel is individually supported, users can choose exactly what number of PV panels to mount and where, and multiple PV panels mounted next to each other may be at substantially the same height and angle. PV panels may be spaced equidistantly from each other in relation to the pole. As previously discussed, the girder assemblies described throughout this disclosure may, in many embodiments, be modular and easy to install. Therefore, girder assemblies and module mounting purlins may be either assembled on-site where they are to be installed for ease of transport, or pre-assembled off-site to improve installation efficiency.

Figure 7:
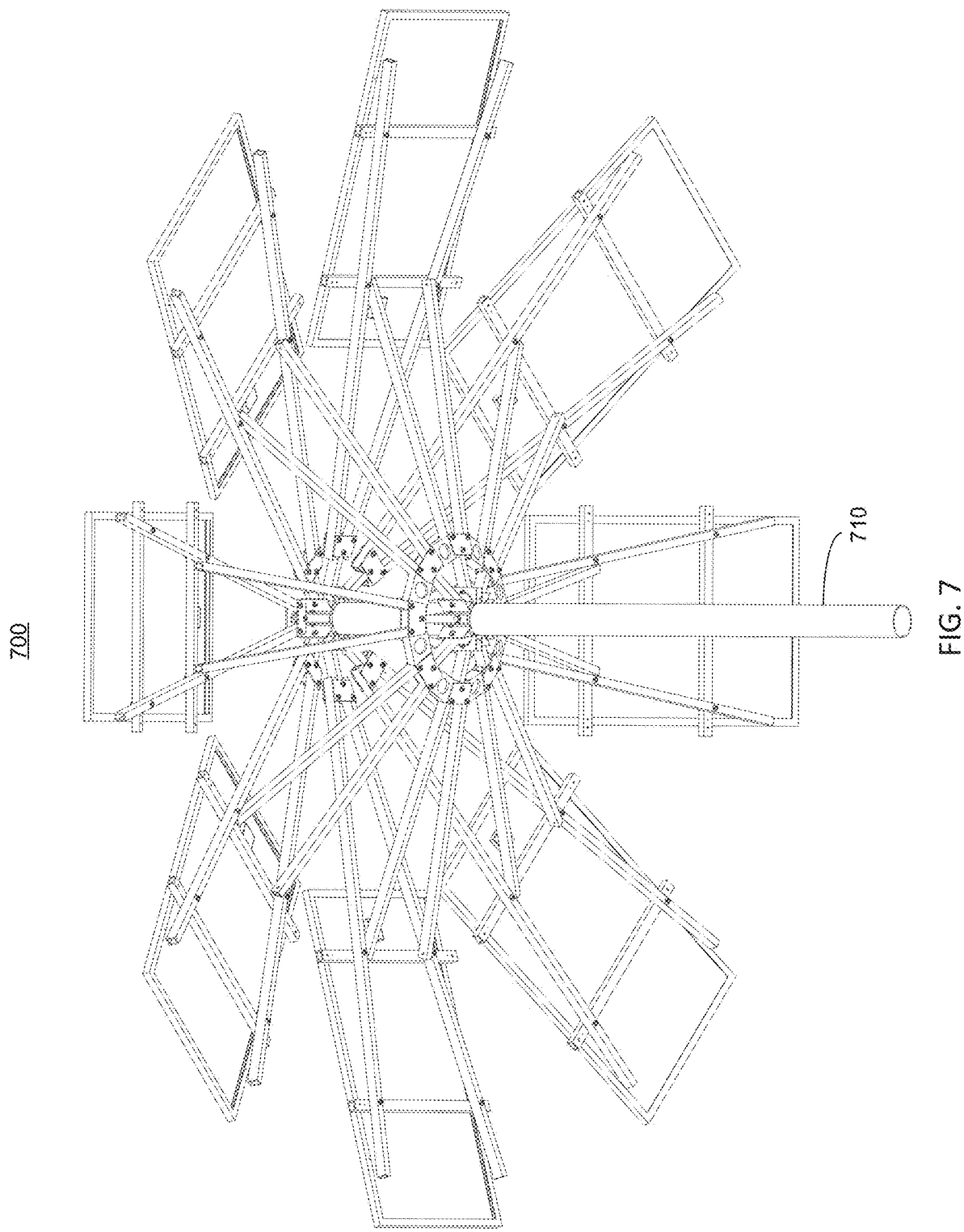
FIG. 7 is a bottom perspective view of the solar panel mounting apparatus of the present disclosure.

FIG. 7 shows a bottom perspective view of a solar panel mounting system 700 as previously described fully assembled and installed on an exemplary street light pole 710.

Figure 8B:
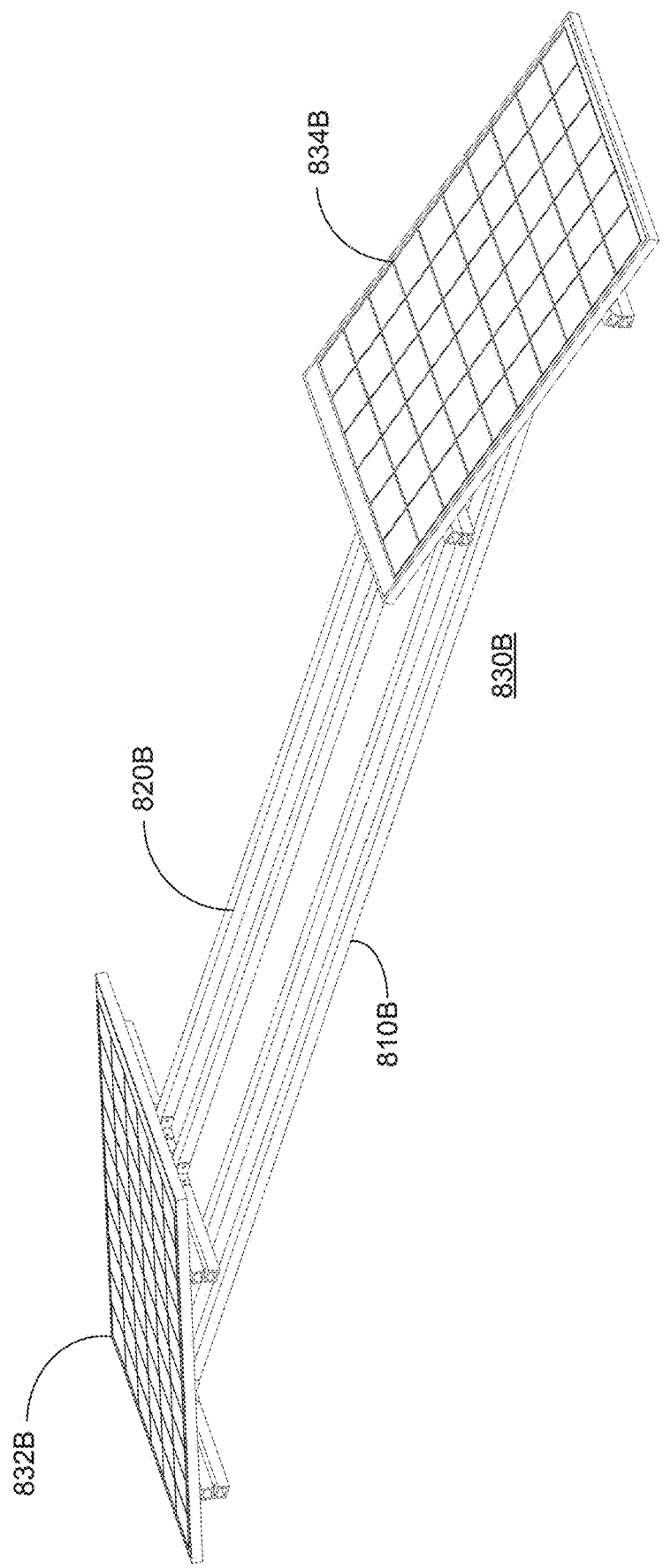

Other embodiments of the disclosure provide a structure for mounting PV modules in pairs of two, such that they are oriented on opposite ends of an axis that is supported in the middle by a pole. The basic building block can be a chord assembly, which includes the PV solar modules mounted as shown in FIGS. 8A and 8B. FIG. 8A shows an embodiment of a bottom chord assembly 810A, which may comprise a pair of bottom chords 811A, lower module mounting purlins 812A and 813A, mounting brackets 814A, and mounting hardware 815A (e.g., screws or bolts). FIG. 8A also shows an embodiment of a top chord assembly 820A, which may comprise similar elements as the bottom chord assembly 810A, though certain elements may be different in size from those of the bottom chord assembly 810A. For example, the top chord assembly 820A may comprise top chords 821A, which may be shorter than bottom chords 811A. Top chord assembly 820A may also comprise top mounting purlins 822A and 823A, mounting brackets, and mounting hardware.

FIG. 8A also shows an entire assembled module mounting block assembly 830A, which comprises the bottom chord assembly 810A, the top chord assembly 820A, and two PV modules 832A and 834A. A perspective view of a module mounting block assembly 830B is shown in FIG. 8B. As shown, a bottom chord assembly 810B is attached to lower portions of PV modules 832B and 834B, and a top chord assembly 820B is attached to upper portions of PV modules 832B and 834B. The bottom and top chord assemblies 810B, 820B may be attached via mounting brackets 814A and mounting hardware 815A, as shown in FIG. 8A, or may be attached by alternative fasteners. FIG. 8A also shows a configuration of multiple module mounting block assemblies attached to a light pole 870A according to an embodiment of the disclosure. As shown, PV modules 840A, 850A, and 860A are all mounted on separate chord assemblies. Advantages to mounting PV modules in pairs using a chord assembly are that two PV panels can provide balance to each other in relation to an attachment point at a pole, and a chord assemblies that are mounted together in stacks may provide additional stability to the other assemblies. Additionally, some users may prefer the aesthetic of adjacent PV modules being different heights in relation to one another.

Figure 9:
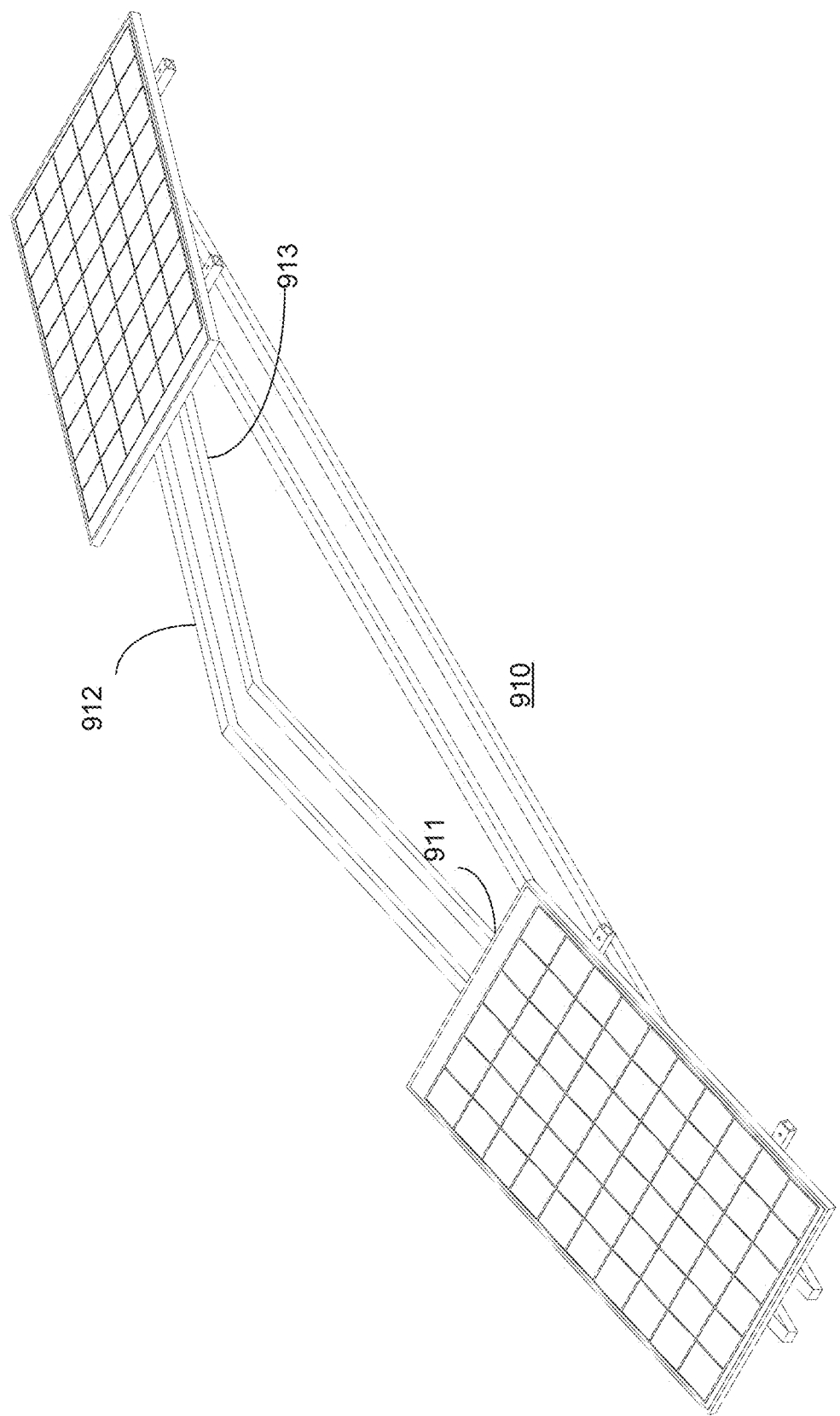
FIG. 9 shows another embodiment of a girder assembly of the present disclosure that may be used to mount two solar panels.

FIG. 9 shows another embodiment of a chord assembly 900 for mounting PV panels in pairs of two. Many structural aspects of this embodiment are similar to the chord assemblies shown in FIGS. 8A and 8B. In this embodiment, a pair of top chords 912 may be angled such that the distal ends 911, 913 of the chords are flush with the desired angle of the PV modules throughout the entire length of the solar panel. The chord assembly 900 may provide additional structural support for holding the angle of the PV module.

Figure 10A:
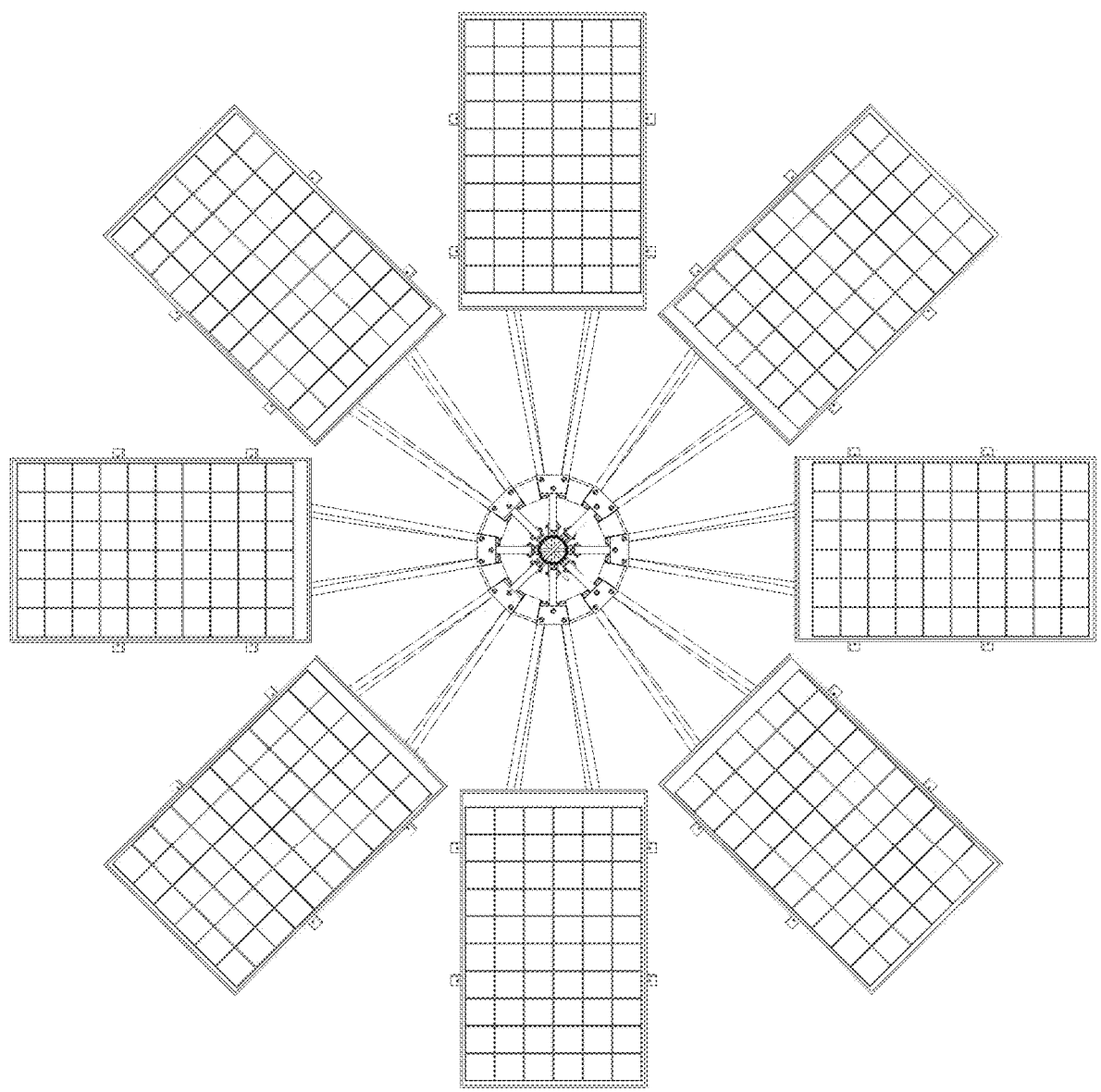
Figure 10B:
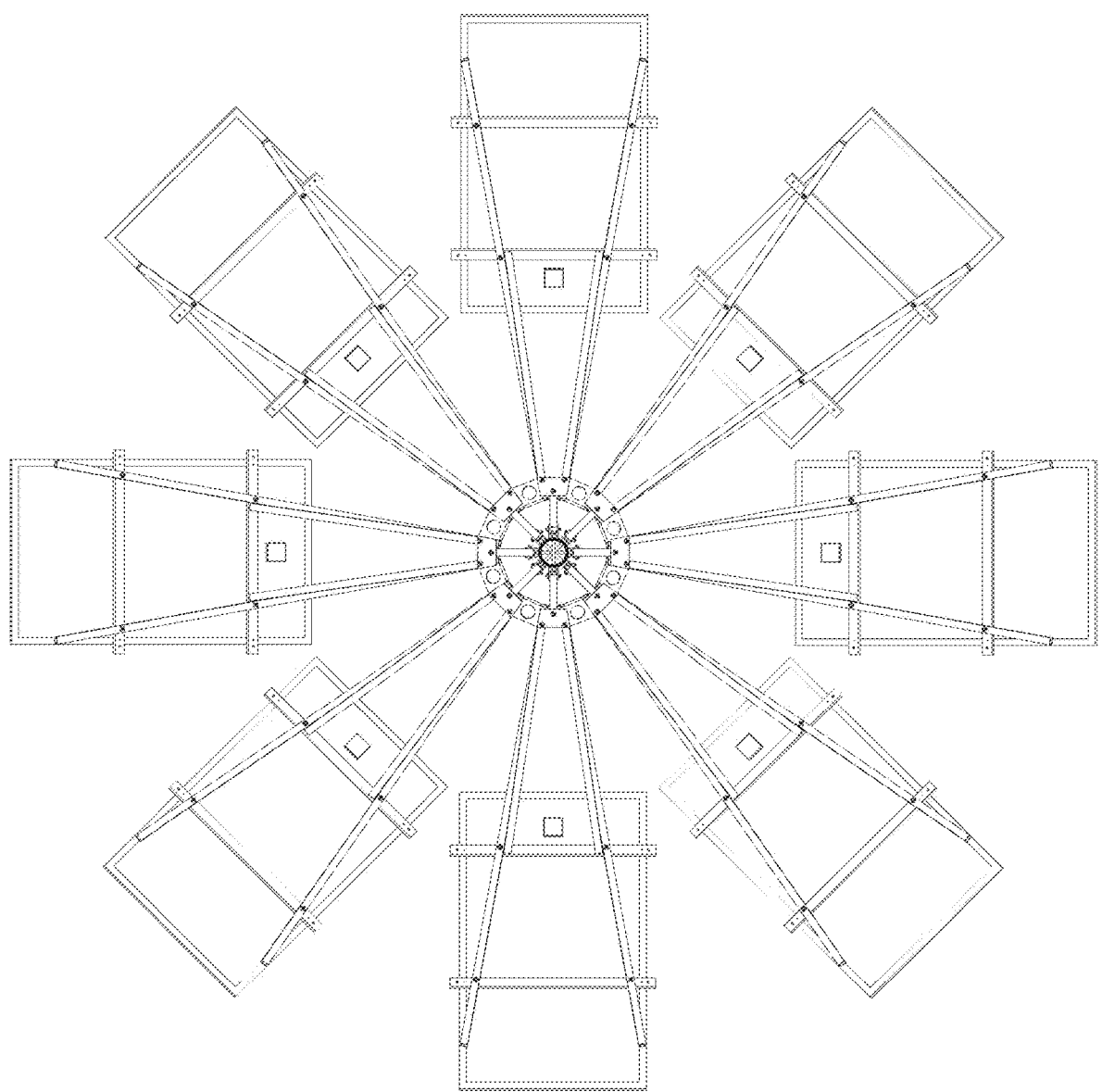

FIG. 10A shows a top view of a fully assembled PV mounting system 1000A in accordance with embodiments of the present disclosure. FIG. 10B shows a bottom view of the same system 1000B, and FIG. 10C shows a side view of the same system 1000C. When the system 1000A, 1000B or 1000C is assembled and comprises a number of PV panels—eight in the embodiment shown—the system 1000A, 1000B or 1000C may generate a significant amount of solar power, especially in relation to the amount of space it takes up on the ground. Indeed, the space on the ground may be considered negligible, because it is only the footprint of an existing pole itself. An advantage to having the PV modules arranged in the configuration of the system 1000 is that because there is space between each PV module, and the modules are not lined up flush with one another to create a single large surface area, it is less likely that wind blowing in from any one direction will create a large wind load in that one direction.

A number of suitable materials may be used for the construction of the girder assemblies and central hubs. Several important considerations in the choice of materials are strength, weight, and weather resistance. Strength is important because of the weight of the PV panels and the fact that the large, flat, angled design of a single PV panel itself makes them prone to catching wind at multiple angles, which can put additional pressure on the girders themselves. Additionally, the weight of the girders and struts themselves is important, because it is preferable not to contribute unnecessary extra weight to the already-heavy PV panels. Weather resistance is also a key consideration, given that the materials will be exposed to all outdoor weather conditions. Further, portions of the girders and struts may also be used to house electrical wires and other electrical components in order to route the generated electricity away from the assembly itself, so weather resistance is important to minimize interference with such components. Therefore, in many embodiments, the girder assemblies, hubs, and components thereof may be fabricated out of metals, such as steel, aluminum, or composites. However, other suitable materials that are strong enough to support the weight of the PV panels and withstand outdoor elements may be used, such as polymers or plastics.

It is contemplated that aluminum or steel may be used for the girders and purlins, while other components may be made of different materials. To reduce weight and allow for the housing of electrical components, the girders and purlins may be of tube or channel construction. In some embodiments, the top girders may be of channel construction, and slightly larger in diameter than the struts, which may be of tube construction, so that the bottom girders may be nested within the top girders during shipping.

Figure 11:
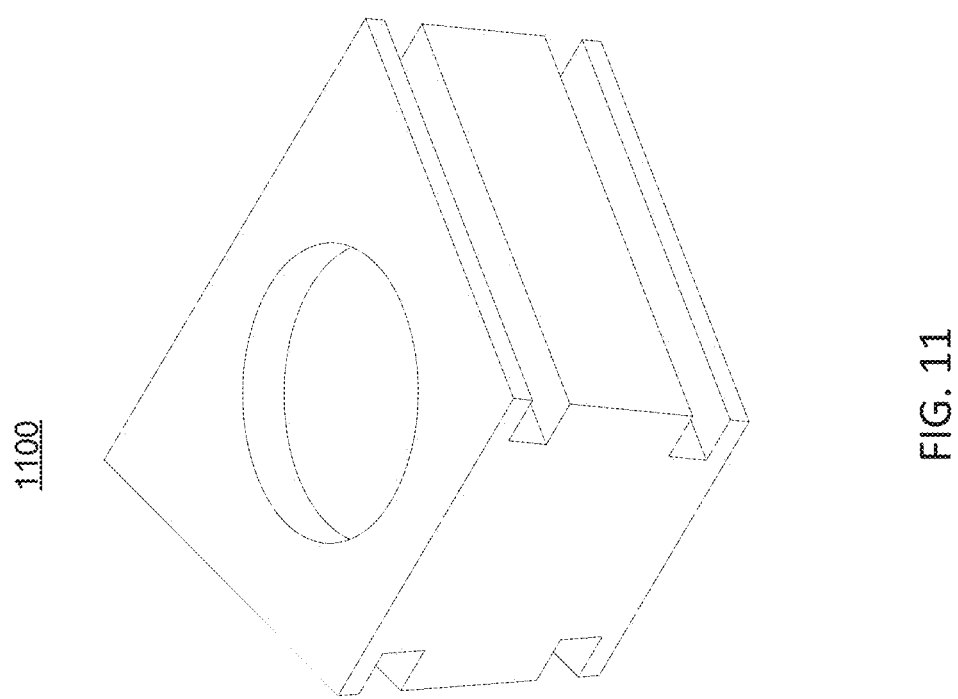
FIG. 11 shows an electrical and connectivity box that may be attached to and integrated with the solar panel mounting apparatus of the present disclosure.

The system 1000A, 1000B or 1000C may have several features that allow for efficient use of the power generated by the solar panels. Another aspect of the present disclosure provides apparatuses for conveniently housing and attaching electrical and connectivity components to the system. FIG. 11 shows an embodiment of an electrical and connectivity box 1100. In many embodiments, the electrical and connectivity box 1100 may house one or more DC-to-AC inverters. Solar power is typically produced as DC power and must be converted to AC for many applications, including sending it to a building, a power outlet, or a utility grid. Depending on the embodiment, the electrical and connectivity box and/or DC-to-AC inverters may be located underneath one or more PV panels, attached to a portion of the girder assembly, or mounted on or near an existing pole itself. In some embodiments, the electrical and connectivity box and/or DC-to-AC inverters may be housed within a ballast or a larger enclosure, as will be described in further detail later in the disclosure.

In embodiments where an individual inverter is mounted directly to each PV panel (e.g., directly to the back, near a junction box), a particular type of inverter known as a "micro-inverter" may be used. Alternatively, if micro-inverters are not used, DC-DC converters or optimizers may be mounted to each PV panel, and then wired to a single inverter that is mounted on the pole. In any of the listed embodiments, the AC that is eventually produced from PV modules and their associated inverters may be wired in parallel and connected to the existing light pole conductors. The conductors for each solar PV module may be attached to and run along or inside of the girders. Conductors from the solar modules and any existing lights from the post may be connected in parallel and run inside of the post. A junction box may be used to combine the solar PV modules and lighting conductors in parallel, which may be housed in, for example, the electrical and connectivity box 1100. A traditional light pole electrical access point may be provided at the base of the light pole to make connections to the existing electrical system and for troubleshooting.

In many embodiments, the solar panel mounting system of the present disclosure (either with or without electrical and connectivity boxes) may be installed on existing light poles, such as those that light streets and parking lots. One apparent benefit from the system is that many existing street lights of any type may be retrofitted not only to power their existing lights, because the multiple solar panels will easily provide more than enough power for the light, but that excess power can also be generated and sent elsewhere. The PV panels mounted with this system may be installed at various heights on the pole, because different types and sizes of hubs can be used. Therefore, even if it is not desirable to install the system at the top height of the pole for any reason, the system may still be installed at a lower height. In other embodiments, the system may be constructed with an entirely new pole or post for a new application. For example, a parking lot previously devoid of shade or power generation could utilize new posts and the system to provide both shade and a new power source. A naturally occurring benefit of the systems of the present disclosure is that the PV panels, when installed, may provide a significant amount of shade where there was none before. Additionally, embodiments of the system may be equipped with shade panels of a canopy to provide even more shade. For example, shade panels may be attached in between individual PV panels or a canopy may be attached to cover the center of an assembled system. In some embodiments, the canopy may be removable or retractable to accommodate for wind or precipitation.

The possible applications of a PV panel mounting system are numerous, and may be implemented in various sizes. For example, a shorter pole may be constructed and a PV panel mounting system may be installed on livestock grazing fields, providing shade for the animals and a power source. In many embodiments, large or small, one or more AC power outlets may be installed near the base of the pole for an individual's use. In a commercial parking lot, customers could charge their phones and groundskeepers could plug in electrical landscaping tools, rather than using inefficient and polluting gas-powered tools. In a park, or by a pool, such systems could be installed for extra shade, outlets for music players, and provide extra power generation for a city or municipality. An advantage to installing the system of the present disclosure in a park, or anywhere remote, is that such systems may be stand-alone and coupled with a battery to power a light at night. No utility electrical wires would need to be run to the new pole, and it would provide light for increased safety and access.

In applications where new poles are used for installing the solar panel mounting apparatus of the present disclosure, a ballast may be used to weight the bottom of the pole and keep it from moving. This ballast may be used when it is impractical to drill the body of a pole deep into the ground or embed the pole in concrete, and may be most advantageous in applications where a ground utility line will not be connected to the pole or in cases where permanently affixing the mounting structure to the ground is undesirable. In some embodiments, the ballast itself may be secured to the ground by any appropriate fastening means, such as drilling. In other embodiments, the ballast may be heavy and stable enough that it does not require being fastened to the ground.

Figure 12B:
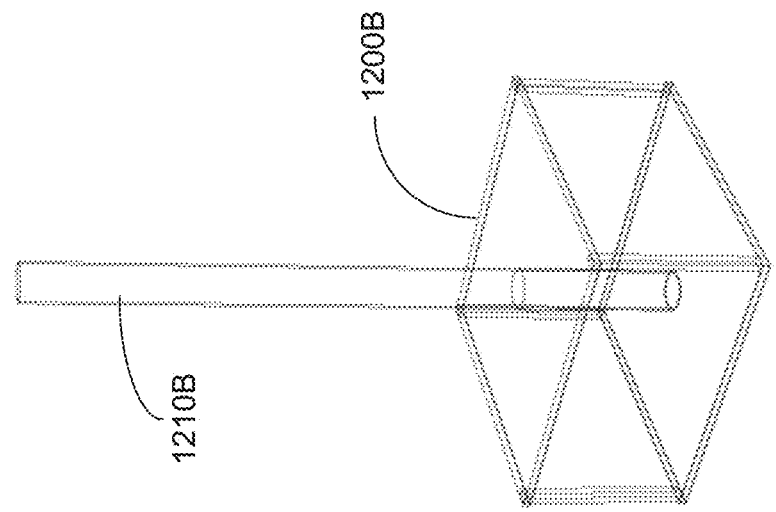
FIGS. 12A and 12B show embodiments of ballasts or base boxes that may be used to form a base of the solar panel mounting apparatus of the present disclosure.
Figure 12A:
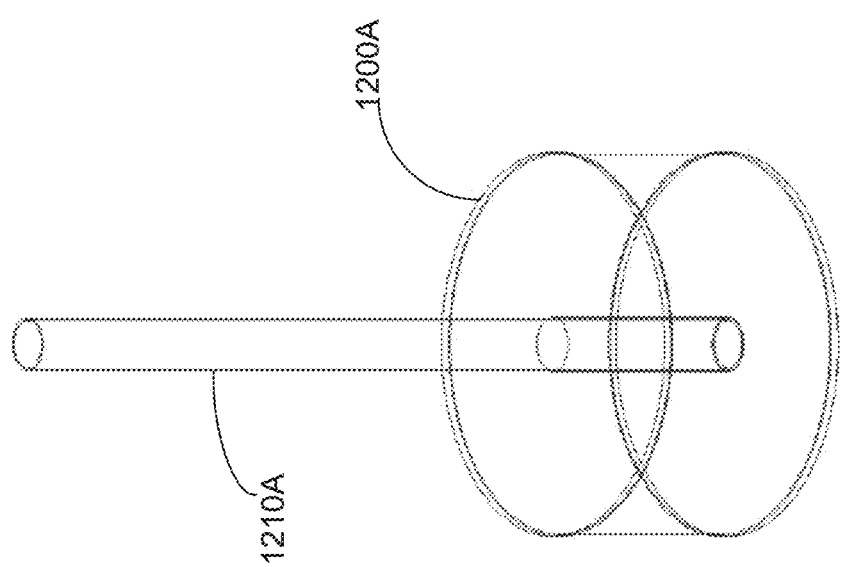

Embodiments of ballasts of the present disclosure are shown in FIGS. 12A and 12B. A ballasted foundation 1200A is depicted as round in shape, and another ballasted foundation 1200B is square in shape. It is contemplated that the ballasted foundation may be polygonal or any suitable shape in order to provide sufficient support for the weight of the pole and the solar panel mounting apparatus. The ballasted foundation may be constructed out of materials such as steel, aluminum, or precast concrete, or any other suitable heavy, durable material that provides sufficient weight and strength. To increase the durability of the outer surface of the ballasted foundation, the material may be painted, or be made of stainless or galvanized metals.

In some embodiments, the ballasted foundation may be partially or completely hollow, and be weighted by adding heavy component materials, such as concrete pavers, blocks, bricks, sand, etc. Such embodiments may be utilized to facilitate shipping and transport of parts of the system. For example, ballasts may be shipped empty to save weight and filled with weighted materials at an installation site. Various attachment mechanisms may be used to connect the ballast to the post, such as bolts, welding, or compression. In some embodiments, the top of the ballast may be sloped away from the post to prevent rain water or snow from accumulating on top of it.

Particular features of the ballast listed herein may be combined to integrate embodiments of the electrical and connectivity box. An electrical and connectivity box of the present disclosure can be configured such that it is suitable for use with either an in-ground, utility connected pole, or a ballasted, non-utility connected pole. It is contemplated that in most embodiments in which a ballasted, non-utility connected pole is implemented, the ballast portion may be used to house, either partially or completely, the electrical and connectivity box. For example, the ballasts 1200A and 1200B in FIGS. 12A and 12B, respectively, may house all or part of an electrical and connectivity box in a portion of the ballasts 1200A and 1200B surrounding the poles 1210A and 1210B and not physically occupied by weighting material. For example, a battery pack may be housed in a portion of the ballasts 1200A or 1200B and surrounded by ballast weighting material such as concrete.

As previously described, the exterior of a ballast may be somewhat large and sturdy, making it suitable for protecting an electrical and connectivity box. A ballast designed to hold an electrical or connectivity box may house one or more of batteries, inverters, DC to DC converters, charge controllers, switches, and other electronic devices. In embodiments, ballasts housing such components may include hinged side or top panels. In some embodiments of a ballasted, non-utility connected pole, the ballast may be configured with a utility power plug in input, so that such a unit may be optionally connected or unconnected to a utility line. Such a configuration may be beneficial when deploying a number of solar panel mounting apparatus systems in areas where it is unknown whether utility lines may be installed in the future or as a backup power source if the solar is unable to maintain the battery charge. These configurations may provide the option of being connected or unconnected to a utility line depending on what option is more efficient for a particular implementation.

Another application of the solar panel mounting apparatus is to provide structural support and power connections for vehicle and battery chargers. As electric and other rechargeable vehicles become more prevalent, the need for vehicle charging stations is becoming greater. Because it is contemplated that PV mounting systems of the present disclosure will be installed in parking lots, along roads, and near residences and businesses, it would be advantageous to attach chargers to the systems. Embodiments of the disclosure may include wiring for solar panels to chargers, batteries for storing extra solar power, converters and/or inverters, structural mounts for chargers, and chargers themselves. Some of these components may be housed in the electrical and connectivity box of the present disclosure, all or part of which may be housed within a ballast.

Figure 13:
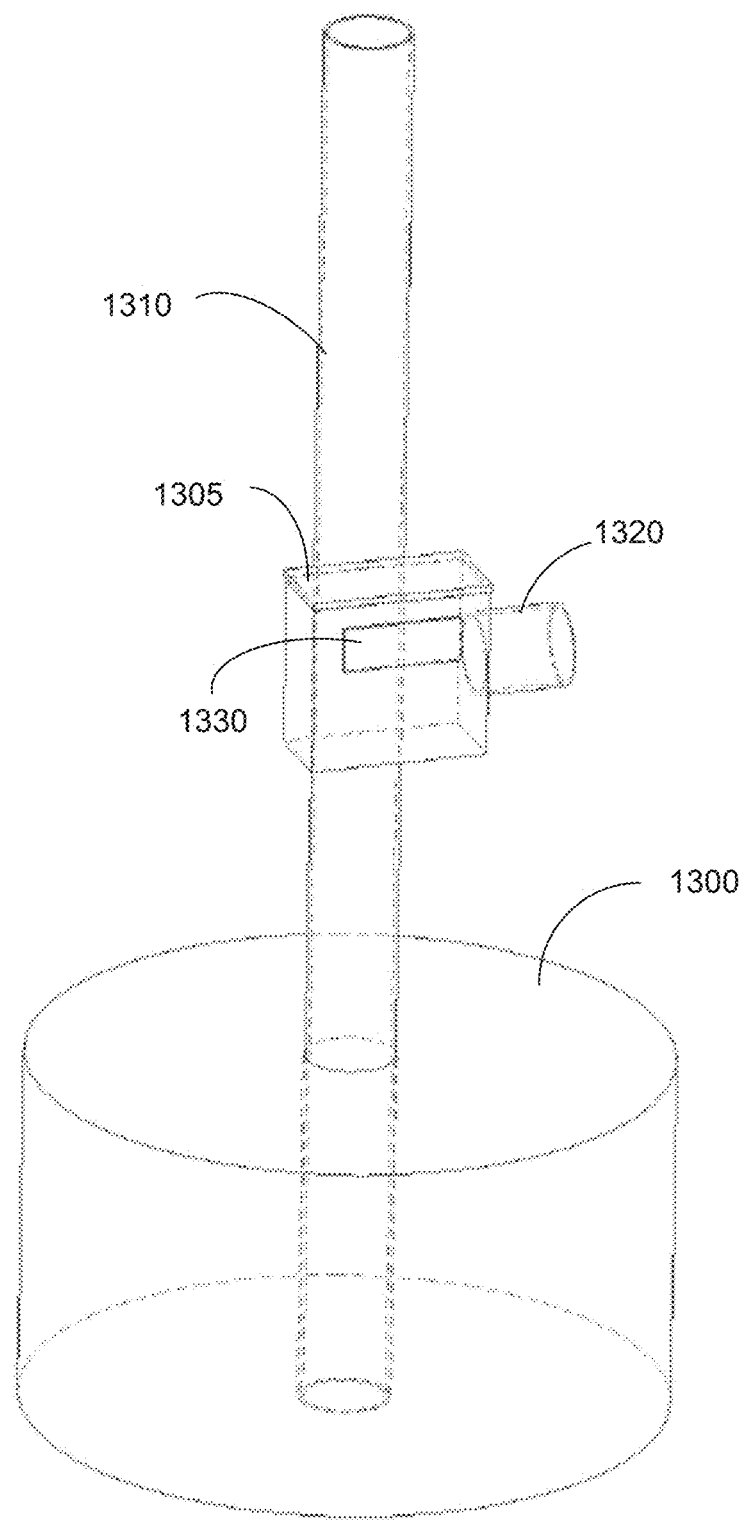
FIG. 13 shows an electric vehicle charging apparatus and a container that may be attached to and integrated with the solar panel mounting apparatus of the present disclosure.

An EV charging system may be mounted to a solar panel mounting apparatus of the present disclosure in a number of ways. An embodiment is shown in FIG. 13. In this disclosure, an "EV charging system" may be used to describe a number of separate components that together work to charge an electric vehicle. As shown in FIG. 13, in some embodiments, all or part of an EV charging system 1305 may be mounted to the post 1310 at a height convenient for most users to charge their vehicles. The EV charging system 1305 may be mounted to a post via a direct bolt, U-bolt, or other compressed connection. It may include a graphical user interface 1330, touchscreen, or other user input mechanism. Existing EV charging systems are continuously being improved to provide faster, more convenient, charging for an ever-increasing variety of vehicles. Therefore, it is contemplated that the various features available now and in the future for EV charging systems may be implemented with solar panel mounting apparatuses of the present disclosure. Such features may include electronics for interfacing with smart phone applications, wireless communication modules, and credit card readers. They may include EV charging plugs (such as EV charging plug 1320 depicted in FIG. 13), and EV charging cord holders. The capabilities of the EV charging systems may vary according to the types of chargers available in the EV charging industry. For example, the EV charging system may be a three-phase or single-phase charger. It may provide Level 1, 2, 3, or 4 charging, as known in the industry. It may be powered by solar, batteries, or utility grid electricity, depending on its mode. Alternatively, it may be completely powered by a combination of solar energy and batteries that store energy, making it completely independent of utility grid electricity.

It is contemplated that an EV charging system and/or an electronics and connectivity box may be desirable on a non-ballasted post that is permanently installed in the ground. In other words, such embodiments of the solar panel mounting apparatus may not have a ballast to house all or a portion of the EV charging system and/or electronics box. Certain posts used with embodiments of the solar panel mounting apparatus may be embedded in concrete, embedded in the ground, may be a driven pile, and may be any shape, such as round, square, or polygonal. In such embodiments, a container known as a "base box" may be used to house the EV charging system and/or electronics and connectivity box. In some embodiments, such as the one shown in FIG. 13, the base box 1300 may be shaped like a ballast and affixed at the bottom of the post on the ground, and in others, it may be affixed higher on the post for ease of access to a user. In embodiments, there may be two base boxes, one on the ground and one on higher on the post. The positions of the base box or boxes may be configured to distribute the weight of some components and provide convenience in reaching others. For example, the base box 1300 at the bottom of the post may be used to store heavy batteries, while a base box located at a person's arm height may be located there to provide access to an EV plug and card reader.

Base boxes according to the present disclosure may be made of steel, aluminum, or other suitable metal, fiber glass, plastic, or composite material. Metal boxes may be galvanized or stainless steel. A base box attached to the post may be bolted, welded or connected by compression, and may include hinged side or top access panels. The tops of base boxes may be sloped to prevent the accumulation or rain or snow. Each of the structures, containers, and electronic components discussed herein, including ballasts, base boxes, EV chargers, and contents of an electronics or connectivity box may be implemented in any combination in accordance with the present disclosure.

Turning now to other embodiments of a solar panel mounting apparatus, smaller, but very similar systems could be installed in an outdoor seating area of a restaurant or coffee shop, or in an individual homeowner's backyard. An outdoor entertainment center—even one somewhat far from a house—could be made of the system as it provides shade like an umbrella, power outlets for individual entertainment devices, and electrical connections for installing a sound system, fans, heaters, or other electronic devices. In certain embodiments, the electrical and connectivity box 1100 may house the connections and/or hardware for these features. For example, the electrical and connectivity box 1100 may itself comprise an audio speaker, a fan, a wireless transceiver (e.g., for Wi-Fi or Bluetooth), and other hardware components. Additionally, a home or small-business-sized version of the system could even be configured with an external plug to provide extra power to the home or business directly or through a solar energy storage battery. Various methods of integration with a smart-home environment and computer applications are contemplated.

Figure 14:
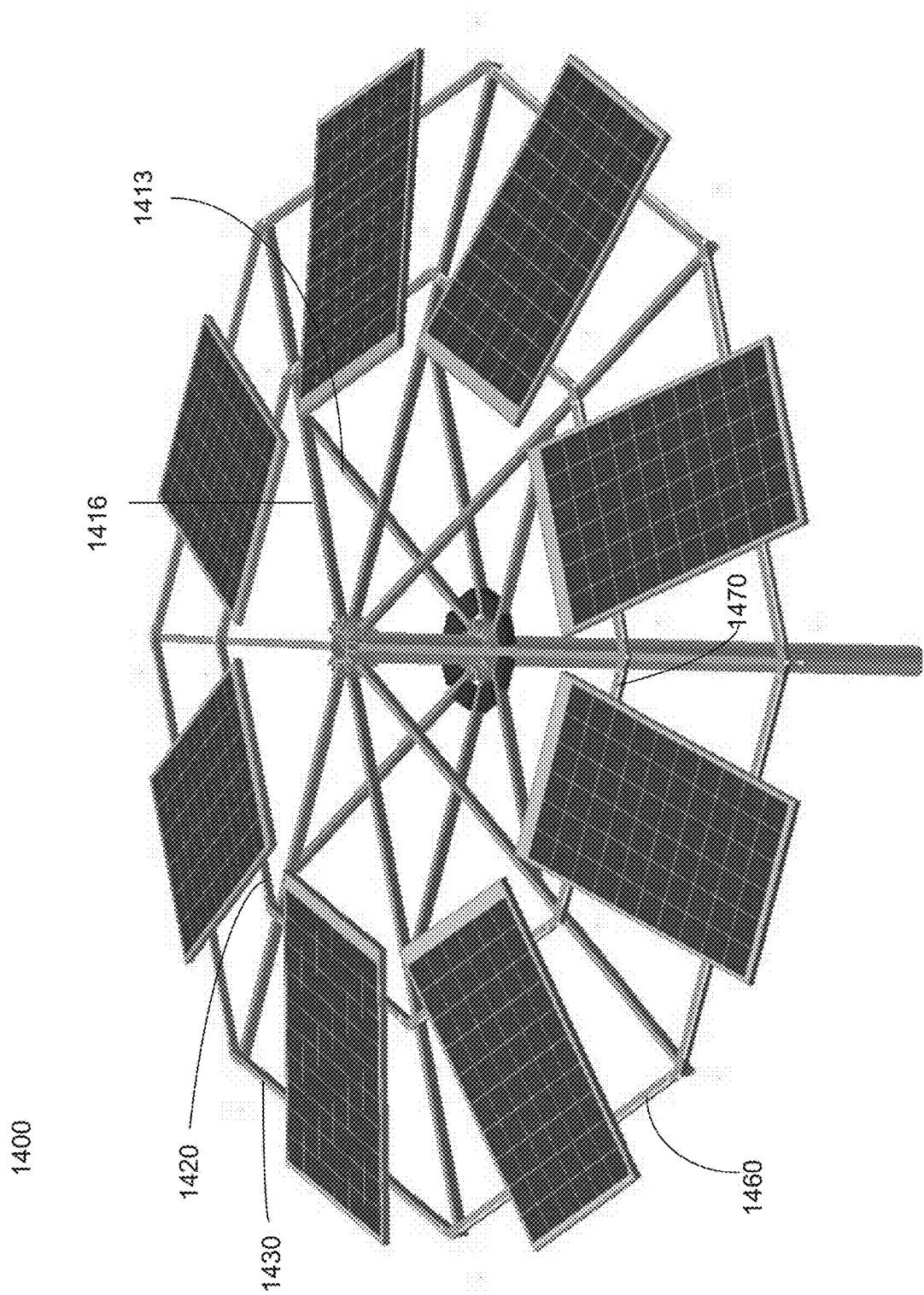
FIG. 14 is a top perspective view of a solar panel mounting apparatus according to another embodiment of the present disclosure.
Figure 21:
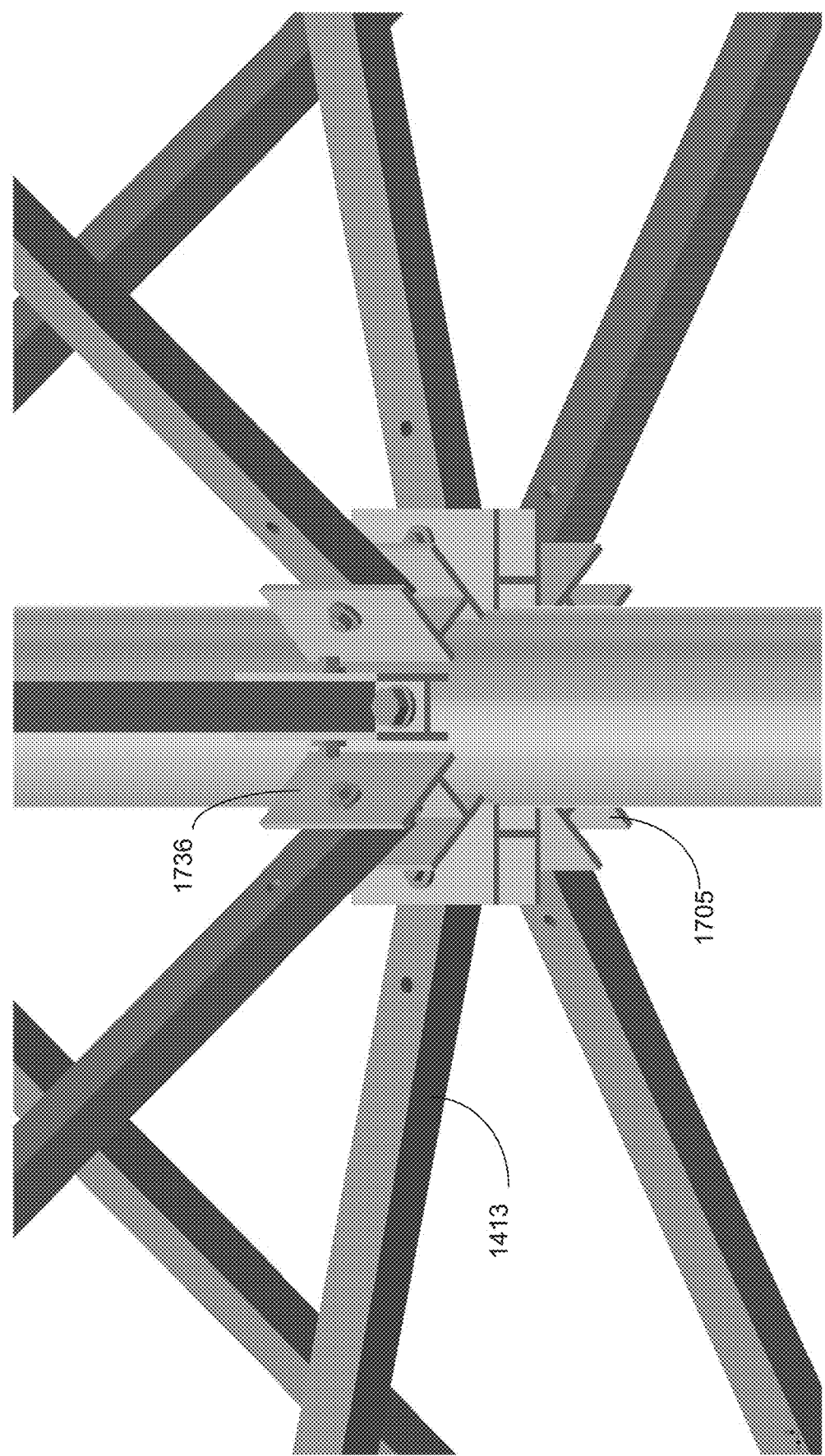
FIG. 21 shows the bottom girders of the solar panel mounting apparatus shown in FIG. 14 attaching directly to the hub.

Turning now to another embodiment of the solar panel mounting apparatus of the present disclosure, FIG. 14 shows an embodiment implementing several structural features that differ from those shown in FIGS. 1-3. As shown, solar panel mounting apparatus 1400 comprises purlins 1420 that have a 360 degree radial connection; in other words, they are connected all the way around the solar panel mounting apparatus. For ease of reference, the solar panel mounting apparatus embodiment of FIG. 14 will be referred to as the "radially connected purlin assembly" 1400. The radially connected purlin assembly 1400 has several structural differences, including that there are no hub girders such as hub girder 343 of FIG. 3, and instead the bottom girders 1413 may attach directly to the hub, as shown in FIG. 21. Another difference is that the number of top 1416 and bottom girders 1413 are reduced by half. In the embodiment shown, each of the top and bottom module mounting purlins 1420, 1430 are radially connected to each other by a plurality of purlin joiners 1460, 1470. Top purlin joiners 1470 may be smaller than bottom purlin joiners 1460, but they may be identical in other regards.

An advantage of the radially connected purlin assembly 1400 is that it may retain the structural strength to support the same number of solar panels as other embodiments described in this disclosure with fewer individual pieces for assembly. Though the purlin joiners 1460 and 1470 are added, hub girders and half of the top and bottom girders are removed. Having fewer pieces saves weight for shipping and time for assembly. The purlin joiners, by radially connecting the entire assembly 1400, may increase the overall stability compared to the other embodiments. It is contemplated that more or fewer girders and purlins may be used in other embodiments to accommodate different sizes and numbers of solar panels. It is also contemplated that embodiments will not be radially connected all the way around, and may not form a full "umbrella" configuration. For example, embodiments may comprise just two top and two bottom girders, two module mounting purlins, and one solar panel. Other embodiments may be similarly configured and accommodate two, three, or four solar panels.

Figure 15:
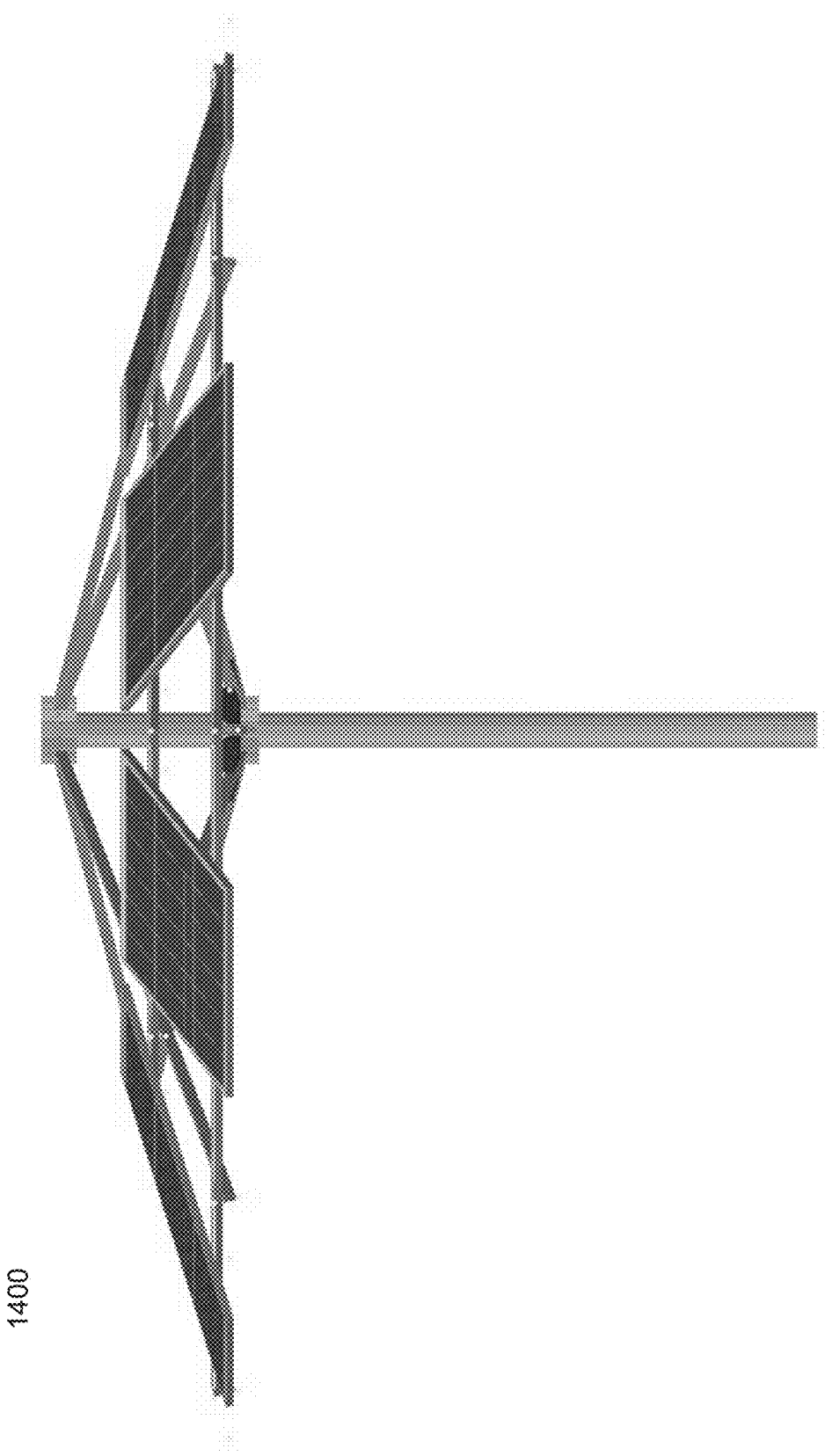
FIG. 15 is a side view of the solar panel mounting apparatus shown in FIG. 14.

FIG. 15 shows a side view of the radially connected purlin assembly 1400. It is contemplated that in other embodiments, the angle of the solar panels in relation to the ground may be different from that shown.

Figure 16:
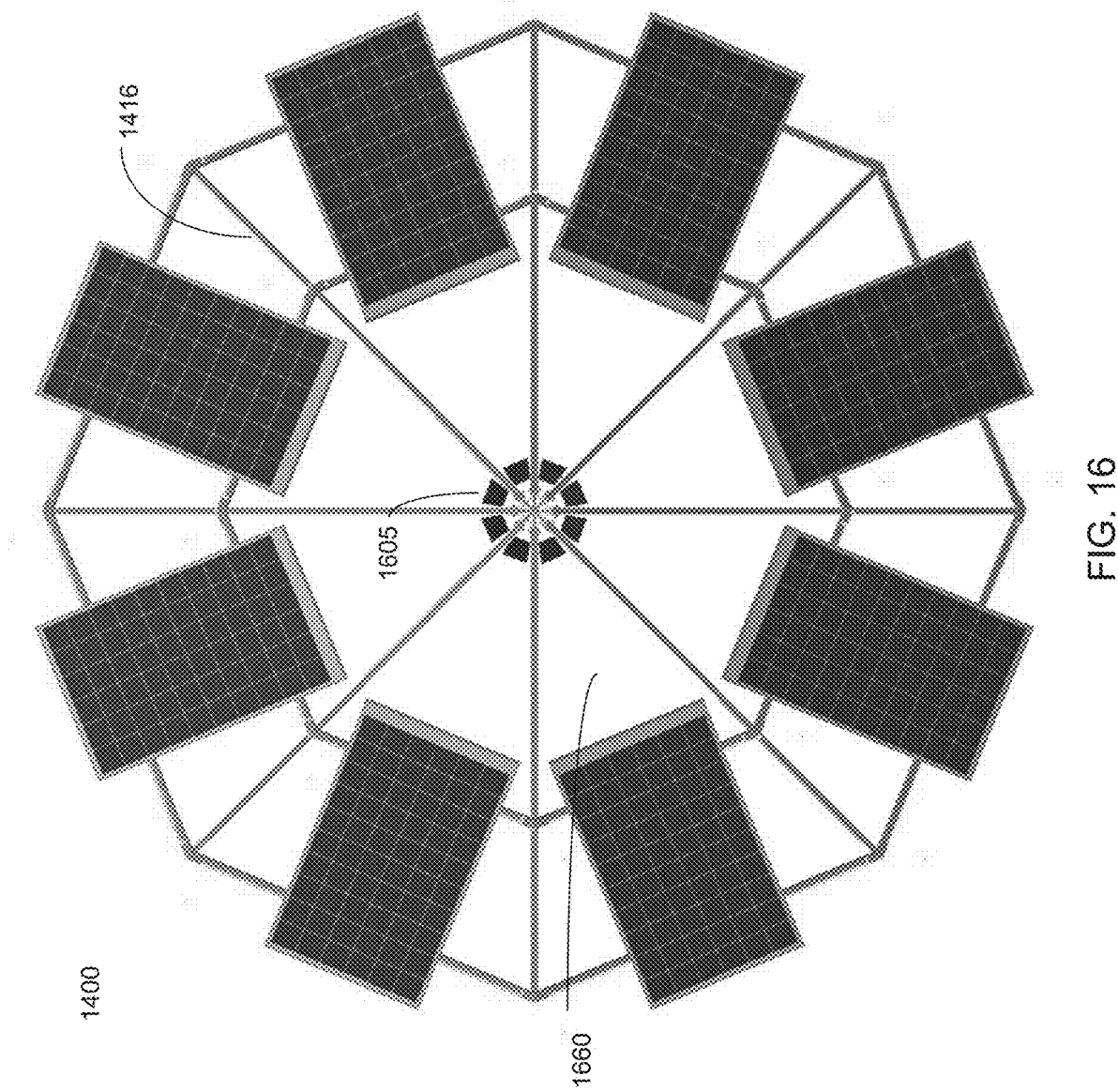
FIG. 16 is a top view of the solar panel mounting apparatus shown in FIG. 14.

FIG. 16 shows a top view of the radially connected purlin assembly 1400. As shown, eight top girders 1416 are connected to a hub 1605, and eight solar panels are mounted on the assembly. More or fewer top girders 1416 may be used, in embodiments.

Figure 17:
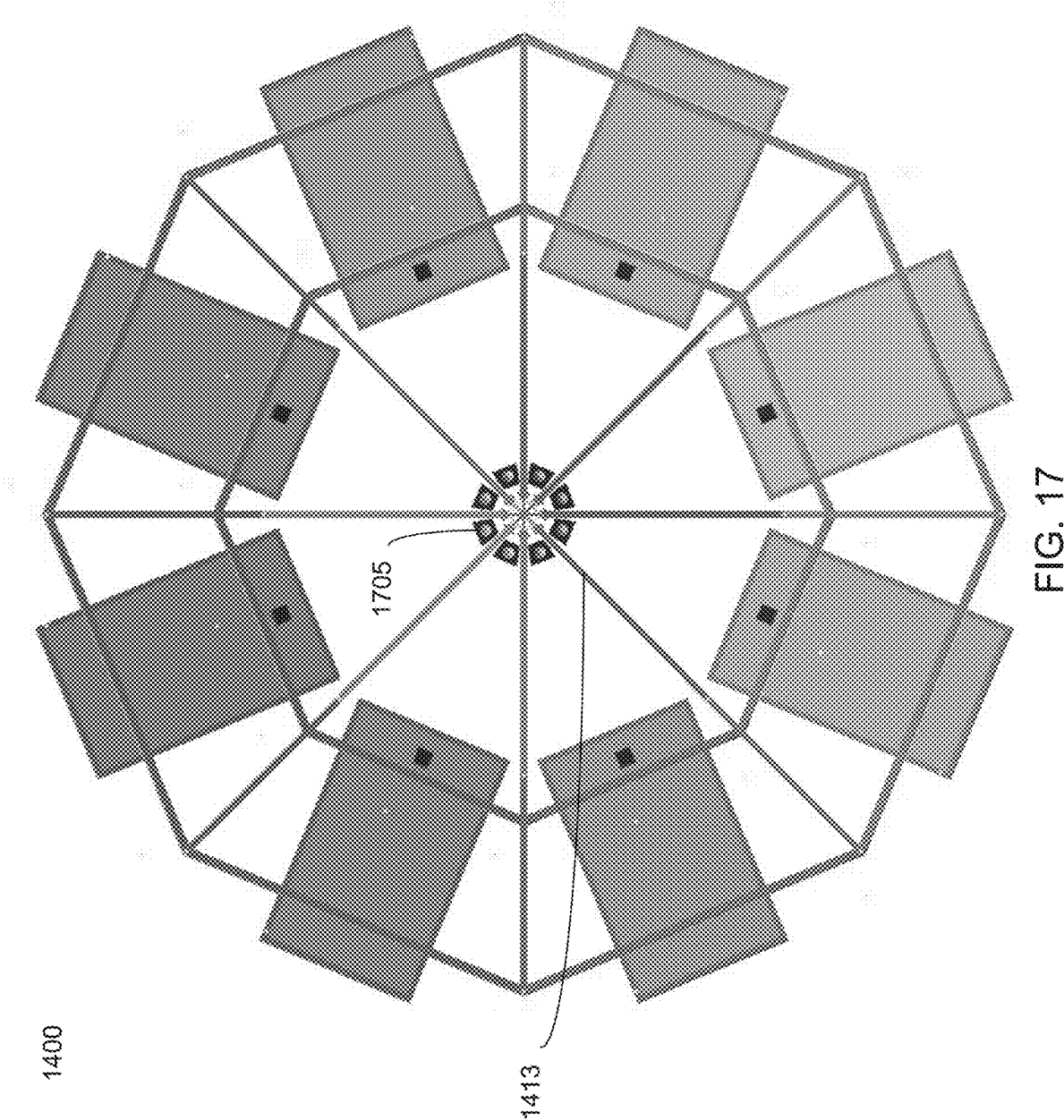
FIG. 17 is a bottom view of the solar panel mounting apparatus shown in FIG. 14.

FIG. 17 shows a bottom view of the radially connected purlin assembly 1400, showing the bottom girders 1413 directly connected to the hub.

Figure 18:
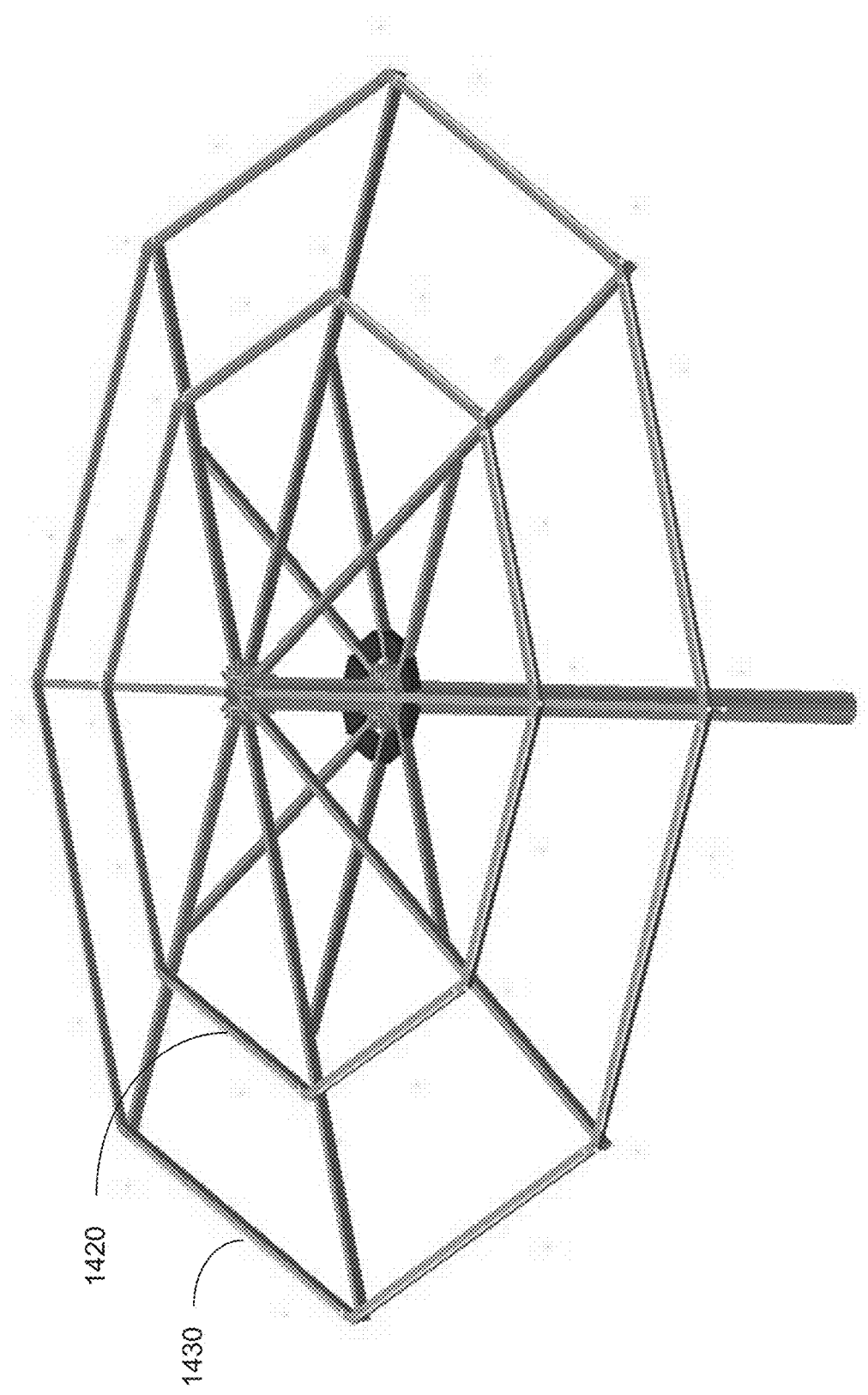
FIG. 18 is a top perspective view of the solar panel mounting apparatus shown in FIG. 14 without solar panels.

FIG. 18 shows a perspective view of the radially connected purlin assembly 1400 without solar panels, illustrating how each of the plurality of the top and bottom module mounting purlins 1420, 1430 are connected 360 degrees around by a plurality of purlin joiners.

FIG. 19A shows a top view of a purlin joiner 1900A. Each of the purlin joiners 1900A may have a plurality of through-holes 1901 for connecting the purlins to the purlin joiners via connection means such as bolts. FIG. 19B shows a side view of the purlin joiner 1900B, and FIG. 19C shows a perspective view of the purlin joiner 1900C.

Figure 20:
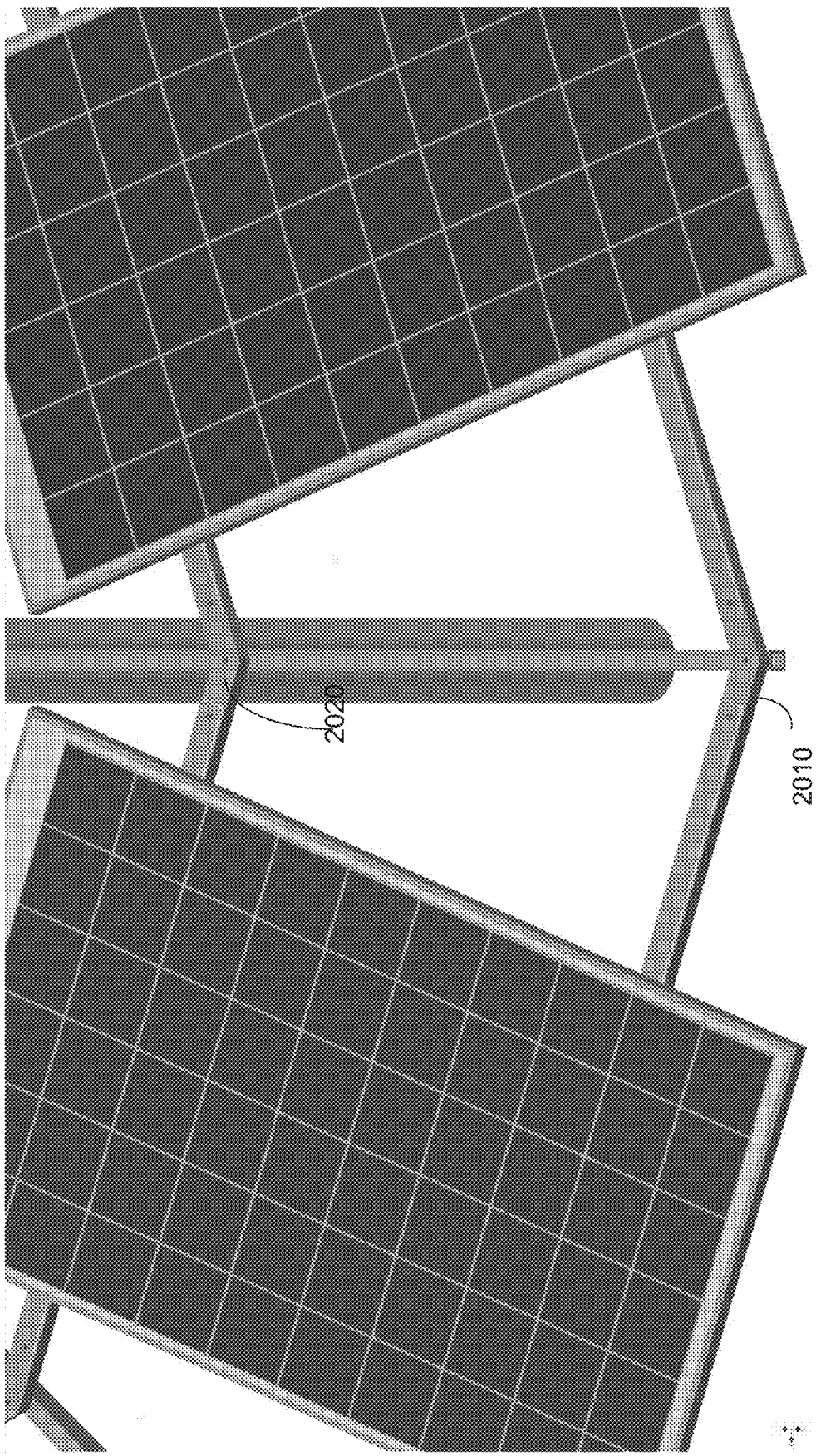
FIG. 20 shows a close-up view of the purlin joiner shown in FIGS. 19A, 19B, and 19C to join purlins.

FIG. 20 shows closeup views of a bottom purlin joiner 2010 and a top purlin joiner 2020. In embodiments, the purlin joiners may be different sizes or may be the same size. In embodiments where they are the same size, the bottom module mounting purlins may be longer than the top module mounting purlins.

Figure 22:
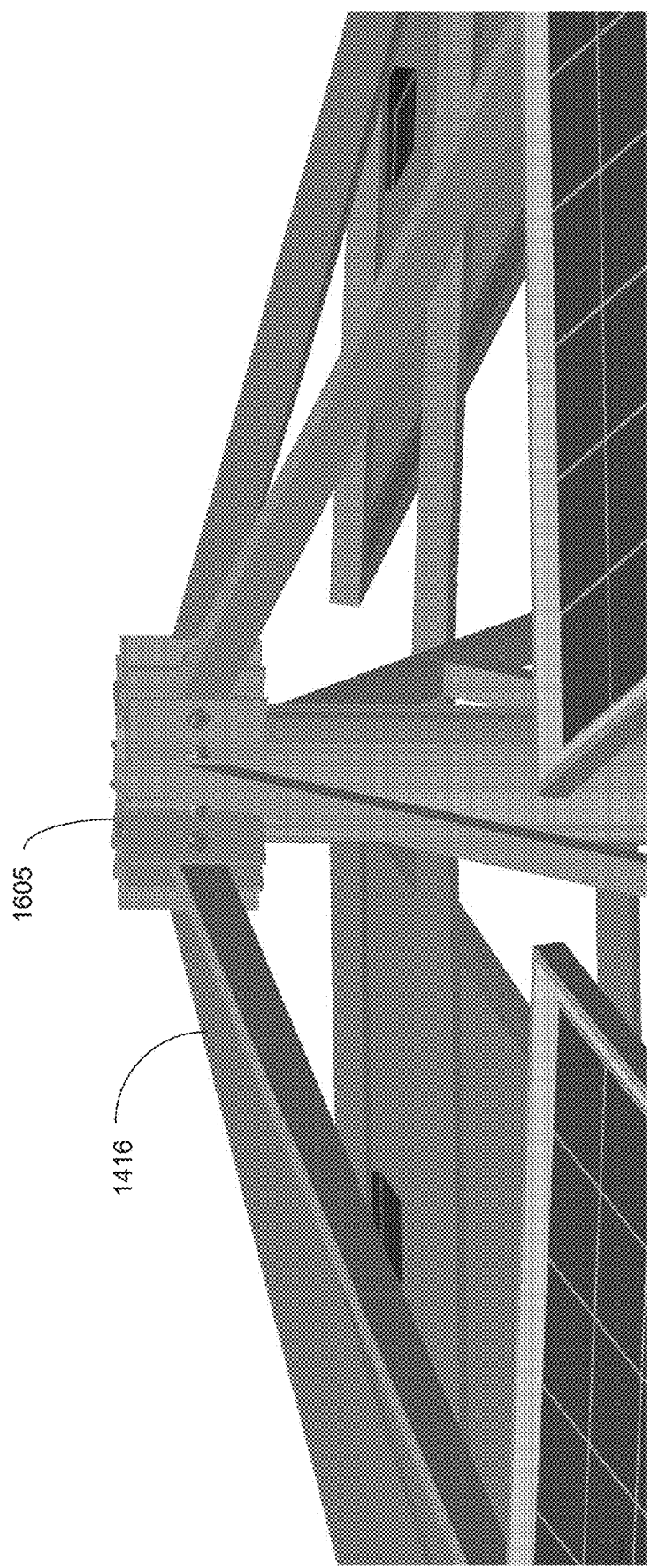
FIG. 22 shows the top girders of the solar panel mounting apparatus shown in FIG. 14 attaching directly to the hub.

FIG. 21, as previously described, shows the bottom girders 1413 directly connected to the bottom hub 1705 via bolts directly through the girders 1413 to the hub 1736. An advantage of connecting the girders directly is that fewer pieces are required as compared to other embodiments described in this disclosure. FIG. 22 shows top girders 1416 directly attached to top hub 1605 in a similar manner.

Because many, if not all of the connections between individual pieces in the radially connected purlin assembly 1400 are made by simple bolt attachments, the assembly 1400 may be put together easily by people who are untrained. Each of the design features shown allow for benefits including ease of shipping, ease of assembly, and ease of use.

Embodiments of the solar panel mounting apparatuses of the present disclosure may also include a profile feature in one or more of the girders that would allow the easy installation of a shade cloth. This may comprise a female profile formed or extruded into the girder that would accept a shade cloth with a metal crimped or riveted matching male piece along the long lengths of a triangle formed by the girders (see, for example, in the top view of FIG. 16, the triangle shapes 1660 formed by the top girder 1416 connections to the hub 1605). The shade cloths may fit in between each girder and be attached to the girders via a sliding action. The installation may comprise sliding the bottom (wider) end of the shade cloth from the top down until it cannot go any further. Such a mechanism may be implemented an easy (and replaceable) addition to the assembly that would provide additional shade. In embodiments, the shade cloth may be white or a highly reflective material that could then act to reflect sunlight to the rear (underside) of the module. This application could significantly improve the generation of the PV array if bifacial modules are used, while also providing a much better shade structure.

The radially connected purlin assembly 1400 design may also facilitate the efficient packaging of component parts in other ways. The top and bottom girder may be designed to "nest", and the module purlins and purlin joiner may be already attached, by rotating them in line with the girders, one going in one direction and the other going in the opposite direction. The preassembly of the girder and purlin assembly could save significant time during installation. One variation of this concept is to have all girder/purlin assemblies attached to the top hub and already installed on the pole for shipping. The bottom hub could also be attached already and installation would simply include attaching each bottom girder to the bottom hub, rotating the module purlins and attaching radially, then adding the modules, and wiring.

The previous description of the disclosed embodiments is provided to enable any person skilled in the art to make or use the present disclosure. Various modifications to these embodiments will be readily apparent to those skilled in the art, and the generic principles defined herein may be applied to other embodiments without departing from the spirit or scope of the disclosure. Thus, the present disclosure is not intended to be limited to the embodiments shown herein but is to be accorded the widest scope consistent with the principles and novel features disclosed herein.

What is claimed is:

1. A solar panel mounting system comprising:
 a top hub and a bottom hub, each of the top hub and the bottom hub comprising:
  a receptacle in a center portion of the hub shaped to receive a pole; and
  a plurality of attachment points affixed to an exterior portion of the receptacle; and
 a girder assembly comprising:
  a plurality of top girders each having a proximal end and a distal end, each of the plurality of top girders being configured to be mechanically fastened to the top hub at their proximal ends, and each of the plurality of top girders having a distance between the distal ends of the top girders that is greater than a distance between the proximal ends of the top girders; and
  a plurality of bottom girders each having a proximal and a distal end, each of the plurality of bottom girders being configured to be mechanically fastened the bottom hub at their proximal ends and each of the plurality of bottom girders being configured to be mechanically fastened to the plurality of top girders; and
  a plurality of mounting module purlins, wherein each of the module mounting purlins connect to at least two of the plurality of top girders, and wherein each of the plurality of mounting module purlins is radially connected to at least one other of the plurality of module mounting purlins.

2. The solar panel mounting system of claim 1, wherein at least some of the plurality of module mounting purlins are radially connected to each other such that they form a continuous connection around a 360-degree radius.

3. The solar panel mounting system of claim 1, further comprising one or more purlin joiners configured to connect at least two of the plurality of module mounting purlins.

4. The solar panel mounting system of claim 1, wherein the plurality of top girders and the plurality of module mounting purlins are configured to mount one or more solar panels in between two of the plurality of top girders.

5. The solar panel mounting system of claim 1, wherein the plurality of bottom girders are configured to attach directly to the bottom hub.

6. The solar panel mounting system of claim 3, wherein the one or more purlin joiners are configured to connect the at least two of the plurality of module mounting purlins via bolts.

7. The solar panel mounting system of claim 1, wherein the plurality of top girders comprises exactly eight top girders.

8. A solar panel mounting system comprising:
a top hub and a bottom hub, each of the top hub and the bottom hub comprising:
   a receptacle in a center portion of the hub shaped to receive a pole; and
   a plurality of attachment points affixed to an exterior portion of the receptacle; and
a girder assembly comprising:
   a plurality of top girders each having a proximal end and a distal end, each of the plurality of top girders being configured to be mechanically fastened to the top hub at their proximal ends, and each of the plurality of top girders having a distance between the distal ends of the top girders that is greater than a distance between the proximal ends of the top girders; and
   a plurality of bottom girders each having a proximal and a distal end, each of the plurality of bottom girders being configured to be mechanically fastened the bottom hub at their proximal ends and each of the plurality of bottom girders being configured to be mechanically fastened to the plurality of top girders; and
   a plurality of mounting module purlins, wherein each of the module mounting purlins connect to at least two of the plurality of top girders, wherein the plurality of top girders and the plurality of module mounting purlins are configured to mount one or more solar panels in between two of the plurality of top girders.

9. The solar panel mounting system of claim 8, wherein at least two of the plurality of module mounting purlins are configured to be attached to each other.

10. The solar panel mounting system of claim 9, wherein at least two of the plurality of module mounting purlins are configured to be attached to each other via a purlin joiner.

11. The solar panel mounting system of claim 9, wherein at least some of the plurality of module mounting purlins are radially connected to each other such that they form a continuous connection around a 360-degree radius.

12. The solar panel mounting system of claim 8, wherein the system is configured to mount exactly one solar panel for each set of top and bottom girder.

13. The solar panel mounting system of claim 8, wherein one or more of the top and bottom girders and are configured to be pre-assembled.

14. A solar panel mounting system comprising:
a top hub and a bottom hub, each of the top hub and the bottom hub comprising:
   a receptacle in a center portion of the hub shaped to receive a pole; and
   a plurality of attachment points affixed to an exterior portion of the receptacle; and
a girder assembly comprising:
   a plurality of top girders each having a proximal end and a distal end, each of the plurality of top girders being configured to be mechanically fastened to the top hub at their proximal ends, and each of the plurality of top girders having a distance between the distal ends of the top girders that is greater than a distance between the proximal ends of the top girders; and
   a plurality of mounting module purlins, wherein each of the module mounting purlins connect to at least two of the plurality of top girders, and wherein each of the plurality of mounting module purlins is radially connected to at least one other of the plurality of module mounting purlins.

15. The solar panel mounting system of claim 14, wherein at least some of the plurality of module mounting purlins are radially connected to each other such that they form a continuous connection around a 360-degree radius.

16. The solar panel mounting system of claim 14, wherein the plurality of top girders and the plurality of module mounting purlins are configured to mount one or more solar panels in between two of the plurality of top girders.

17. The solar panel mounting system of claim 14, further comprising a plurality of bottom girders each having a proximal and a distal end, each of the plurality of bottom girders being configured to be mechanically fastened the bottom hub at their proximal ends and each of the plurality of bottom girders being configured to be mechanically fastened to the plurality of top girders.

18. The solar panel mounting system of claim 17, wherein the plurality of bottom girders are configured to attach directly to the bottom hub.

19. The solar panel mounting system of claim 14, wherein the system is configured to mount up to eight solar panels.

20. The solar panel mounting system of claim 14, wherein at least some of the plurality of module mounting purlins are radially connected to each other such that they form a continuous connection around a 360-degree radius.

* * * * *